(12) United States Patent
Bonora et al.

(10) Patent No.: US 7,410,340 B2
(45) Date of Patent: Aug. 12, 2008

(54) DIRECT TOOL LOADING

(75) Inventors: Anthony C. Bonora, Portola Valley, CA (US); Michael Krolak, Los Gatos, CA (US); Roger G. Hine, Menlo Park, CA (US)

(73) Assignee: Asyst Technologies, Inc., Fremont, CA (US)

( * ) Notice: Subject to any disclaimer, the term of this patent is extended or adjusted under 35 U.S.C. 154(b) by 304 days.

(21) Appl. No.: 11/064,880

(22) Filed: Feb. 24, 2005

(65) Prior Publication Data

US 2006/0188358 A1  Aug. 24, 2006

(51) Int. Cl.
*B65G 1/133* (2006.01)

(52) U.S. Cl. .............. 414/217.1; 414/416.05; 414/940; 198/463.3

(58) Field of Classification Search .............. 414/217.1; 198/346.2
See application file for complete search history.

(56) References Cited

U.S. PATENT DOCUMENTS

| | | | |
|---|---|---|---|
| 6,071,059 | A | 6/2000 | Mages et al. |
| 6,135,698 | A | 10/2000 | Bonora et al. |
| 6,138,721 | A | 10/2000 | Bonora et al. |
| 6,188,323 | B1 * | 2/2001 | Rosenquist et al. ...... 340/686.5 |
| 6,223,880 | B1 * | 5/2001 | Caspi et al. .............. 198/346.2 |
| 6,308,818 | B1 * | 10/2001 | Bonora et al. ............ 168/465.1 |
| 6,364,593 | B1 * | 4/2002 | Hofmeister et al. ....... 414/217.1 |
| 6,364,595 | B1 | 4/2002 | Bonora et al. |
| 6,375,403 | B1 | 4/2002 | Mages et al. |
| 6,419,438 | B1 | 7/2002 | Rosenquist |
| 6,435,330 | B1 * | 8/2002 | Bonora et al. ............ 198/346.3 |
| 6,443,686 | B1 | 9/2002 | Wiesler et al. |
| 6,481,558 | B1 * | 11/2002 | Bonora et al. ............ 198/346.2 |
| 6,530,736 | B2 | 3/2003 | Rosenquist |
| 6,533,101 | B2 | 3/2003 | Bonora et al. |
| 6,609,876 | B2 | 8/2003 | Mages et al. |
| 6,736,582 | B1 | 5/2004 | Mages et al. |
| 6,869,263 | B2 | 3/2005 | Gilchrist |
| 6,877,944 | B2 | 4/2005 | Peiter |
| 6,955,197 | B2 | 10/2005 | Elliott et al. |
| 7,066,707 | B1 * | 6/2006 | Bonora et al. ............ 414/744.3 |
| 2002/0105236 | A1 * | 8/2002 | Fosnight et al. .......... 307/326 |

(Continued)

FOREIGN PATENT DOCUMENTS

GB  2 362 373 A  11/2001

(Continued)

*Primary Examiner*—Saul J. Rodriguez
*Assistant Examiner*—Joshua I Rudawitz
(74) *Attorney, Agent, or Firm*—Martine Penilla & Gencarella, LLP

(57) ABSTRACT

The present invention comprises a container transport and loading system. The system generally comprises a load port for presenting articles to a tool and a container transport system. In one embodiment, the load port includes a vertically movable FOUP advance plate assembly that is adapted to load and unload a FOUP from a conveyor that passes by the load port and move the FOUP horizontally. In another embodiment, the load port includes a vertically movable support structure that is adapted to load and unload a container from a shuttle that passes by the load port. The various embodiments of the load port and container transport system are improvements over conventional container transport systems. The present invention also includes a shuttle for simultaneously transporting multiple containers that a load port may load or unload a container from.

19 Claims, 24 Drawing Sheets

U.S. PATENT DOCUMENTS

| | | |
|---|---|---|
| 2002/0187024 A1 | 12/2002 | Nulman |
| 2003/0007849 A1 | 1/2003 | Wiesler et al. |
| 2003/0012625 A1* | 1/2003 | Rosenquist ............... 414/217.1 |
| 2003/0031538 A1* | 2/2003 | Weaver .................... 414/217.1 |
| 2003/0202868 A1 | 10/2003 | Bachrach |
| 2003/0235486 A1* | 12/2003 | Doherty et al. .......... 414/217.1 |
| 2004/0081546 A1 | 4/2004 | Elliott et al. |

FOREIGN PATENT DOCUMENTS

| | | |
|---|---|---|
| JP | 11-145243 | 5/1999 |

* cited by examiner

DIRECT TOOL LOADING

FIELD OF THE INVENTION

The present invention generally relates to an automated material handling system (AMHS). More specifically, the present invention comprises a load port having a vertically movable container support structure that is able to load and unload containers directly from a container transport system.

BACKGROUND OF THE INVENTION

It is costly to deliver containers, such as Front Opening Unified Pods (FOUPs) and Standard Mechanical Interface (SMIF) pods, to processing tools and load ports in a semiconductor fabrication facility. One method of delivering FOUPs between processing tools is an overhead transport (OHT) system. The OHT system lowers a FOUP onto the kinematic plate of the load port at approximately 900 mm height from the fabrication facility floor. An OHT system uses sophisticated ceiling mounted tracks and cable hoist vehicles to deliver FOUPs to, for example, a load port of a processing tool. The combination of horizontal moves, cable hoist extensions, and unidirectional operation, must be coordinated for transporting FOUPs quickly between processing tools. A transport vehicle must be available at the instant when a processing tool needs to be loaded or unloaded for best efficiency.

OHT systems are often mounted on portions of a facility ceiling, and therefore, are located above the processing tools and load ports. OHT systems utilize free space in the fabrication facility as the processing tools are typically floor mounted equipment. Ceiling mounted OHT systems must raise or lower a container a substantial distance between the OHT track and, by way of example only, a load port. An OHT system preferably has a very high cleanliness performance because any particles created from moving FOUPs along the track may fall onto the tool areas located underneath and potentially damage wafers.

Rail guided vehicles (RGVs) and automatic guided vehicles (AGVs) are often utilized in semiconductor fabrication facilities to move containers along the facility floor between processing tools. RGV's and AGV's are easier to access for maintenance purposes than an OHT system and are typically less costly than ceiling mounted OHT systems. Particle control is also simplified because particles generated by an RGV or AGV remain below the datum plane of a load port. RGVs and AGVs, however, occupy valuable floor space—which is at a premium in a semiconductor fabrication facility.

Wafer throughput could be improved in a semiconductor facility by delivering wafers to tools by both a floor-based transport system and an OHT system. For example, an OHT system could deliver the FOUP to a processing tool while the numerous container deliveries between adjacent processing tools are handled by a floor based transport system. This would be the case, for example, when process tools require that the first wafer of every FOUP be tested on a metrology tool in the bay.

Accordingly, there is a need for an improved FOUP delivery system in semiconductor fabrication facilities. The present invention provides a FOUP delivery system that reduces the cost of FOUP delivery, increases accuracy of FOUP delivery, simplifies installation and maintenance, improves the cleanliness performance and reduces delays associated with conventional FOUP transport systems.

SUMMARY OF THE INVENTION

One aspect of the present invention is to provide a transport system to move containers efficiently between a tool and a conveyor. In one embodiment, the present invention provides a load port having a vertically movable kinematic plate. The load port lifts a container, for example, directly off a conveyor—reducing the number of times the container is handled during transport and tool loading.

Another aspect of the present invention is to provide a transport system that complements OHT systems and functions as the primary AMHS for a bay (e.g., row of tools) or for the entire fabrication facility. In one embodiment, the present invention includes a floor mounted conveyor for transporting containers throughout the fabrication facility. Each load port includes a vertically movable support plate to load and unload a container directly from the conveyor. In another embodiment, the support plate comprises a carrier advance plate assembly for moving the support plate horizontally. The conveyor may also be flush with the facility floor, beneath the facility floor or raised above the facility floor. Other embodiments of the present invention utilize RGVs, AGVs and person guided vehicles (PGVs) to transport containers throughout the fabrication facility.

Still another aspect of the present invention is to provide a transport and delivery system that is easy to service. OHT systems are located high off the facility floor. Thus, OHT systems are not as easy to access as a floor-based transport system. In one embodiment, a conveyor is mounted to the facility floor. Service personnel can easily access the conveyor for maintenance purposes. In another embodiment, a load port having a two-stage vertical lift for accessing a conveyor located below the facility floor is located completely above the facility floor when the lift is located in a raised position. In this compact stage, the load port can be removed from the tool and lifted over the conveyor.

Yet another aspect of the present invention is to provide a transport system with safety features. In one embodiment, the present invention includes a safety rail that separates the conveyor from the rest of the facility. The rail provides a barrier to prevent a tool operator from coming into contact with a moving container. Another embodiment of the present invention encloses the conveyor within an isolation tube. The tube also prevents a tool operator from coming into contact with a moving container and, at the same time, may isolate the container or article from the rest of the facility and associated particulate effects. Floor-based transport systems (e.g., conveyor, RGV, AGV) also eliminate the concern that a container will fall from an OHT system and injure an operator.

Another aspect of the present invention is to provide a floor-based transport and delivery system that occupies a similar or smaller foot print than occupied by a conventional load port and floor-based container transport system (e.g., AGV). In one embodiment, the present invention, which comprises a floor mounted conveyor and a load port, occupies the same footprint typically occupied solely by a conventional load port. In another embodiment, the present invention, which comprises a shuttle and load port, also occupies a small footprint on the facility floor.

Another aspect of the present invention is to provide a container transport and delivery system that improves the cleanliness performance without compromising the integrity of the wafers. In one embodiment, containers are transported along a conveyor that passes below the container plate advance assembly of each load port. In another embodiment, a shuttle transports containers along the facility floor below the datum plane of each load port. In yet another embodiment, containers are transported by an AGV or RGV that travels along the facility floor and passes each load port below the container plate advance assembly. Particles generated by these transport systems fall to the facility floor and do not contaminate wafers being processed by the processing tool.

Another aspect of the present invention is to provide a transport and delivery system that does not require extensive modifications to the existing process tools, fabrication facility layout or fabrication software in order to run efficiently with existing systems. In one embodiment, the load port secures to the front end of a tool through a BOLTS interface (SEMI Standard E63) or the proposed BOLTS-light standard. The controls, which are typically located in a housing underneath the container plate advance assembly, are relocated inside the load port. Thus, a processing tool does not have to be modified at all to accommodate a load port according to the present invention.

DETAILED DESCRIPTION OF THE INVENTION

Semiconductor Equipment and Materials International (SEMI) has created standards for semiconductor wafer manufacturing equipment (see http://www.semi.org). The SEMI Standards govern acceptable tolerances and interfaces for semiconductor manufacturing equipment. The inventions described herein are not limited to semiconductor manufacturing equipment for handling FOUPs.

By way of example only, the various embodiments of the present invention may also be used and/or adapted for systems handling SMIF pods, reticle containers, flat panel display transport devices, or any other container or processing tool. Container is defined as any type of structure for supporting an article including, but not limited to, a semiconductor substrate. By way of example only, a container comprises a structure that comprises an open volume whereby the article can be accessed (e.g., FPD transport) or a container having a mechanically openable door (e.g., SMIF pod and FOUP). Load port is defined as interface equipment that handles containers. For purposes of describing this invention, however, only load ports for handling FOUPs will be referenced.

Figure 4:
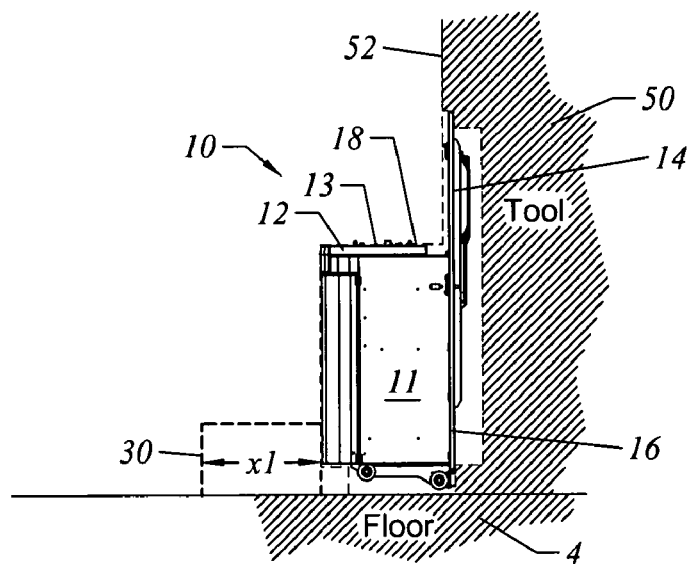
FIG. 4 is a plan view of a conventional load port mounted to a processing tool, according to the prior art.
Figure 5:
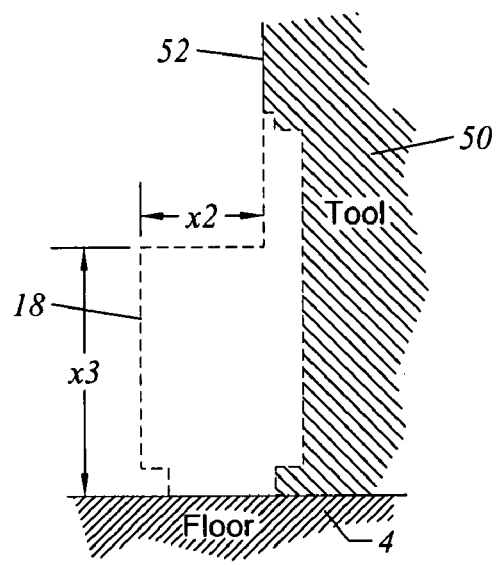
FIG. 5 is a plan view illustrating a profile of a conventional load port, according to the prior art.
Figure 6:
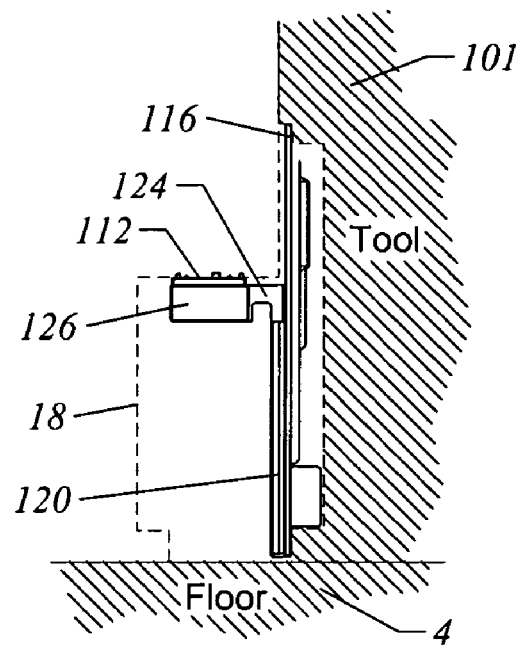
FIG. 6 is a plan view of an embodiment of the present invention, illustrating a profile of a load port according to the present invention.
Figure 7:
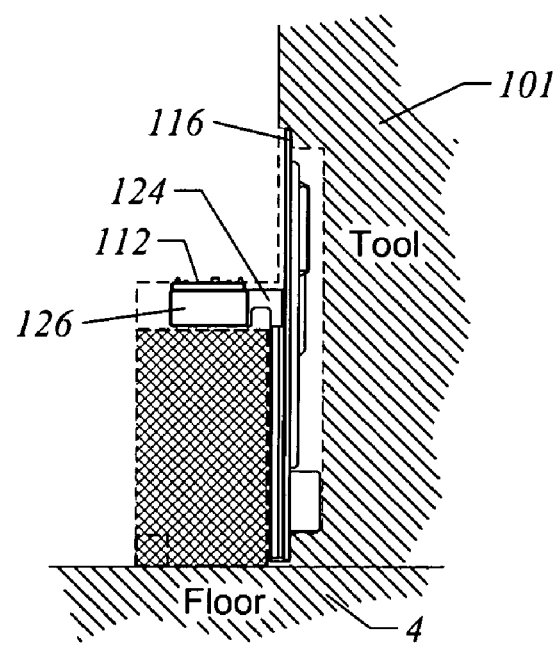
FIG. 7 is a plan view of the embodiment shown in FIG. 6, illustrating the space allocated under the FOUP advance plate assembly for a container transport system.

FIGS. 4-5 illustrate a conventional load port 10 for handling FOUPs (e.g., Asyst Technologies, Inc.'s IsoPort™). The load port complies with, at a minimum, SEMI Standards E15.1, E47.1, E57, E62, E63, E64, S2-93A, S8-95 and 1300L. The load port 10 includes, among other things, a housing 11, a FOUP advance plate assembly 12, a kinematic plate 13, a port door 14 and a fastening or mounting plate 16 having an opening (not shown). The mounting plate 16 secures to the front end 52 of a processing tool 50 through, for example, a BOLTS Interface. The mounting plate 16 may comprise a unitary structure or be constructed of multiple pieces. The port door 14 moves between a closed position (as shown in FIG. 4) and an open position. The term "closed position" means any position of the port door 14 that prevents an article, such as a wafer, from passing through the opening in the mounting plate 16. The term "open position" means any position of the port door 14 that allows an article, such as a wafer, to pass through the opening in the mounting plate 16, including the position whereby the port door 14 does not block any portion of the opening.

The kinematic plate 13 is adapted to receive and support a FOUP 2. The kinematic plate 13 includes, among other things, kinematic pins 18, a latch assembly and FOUP detection sensors. The kinematic pins 18 align the FOUP on the kinematic plate 13. The latch assembly secures the FOUP to the kinematic plate 13. The FOUP advance plate assembly 12 moves the kinematic plate 13 horizontally between a load/unload position and a position whereby the FOUP door is located proximate to the port door. In the load/unload position, a FOUP may be transferred onto or off of the kinematic plate 13 by, for example, and OHT system or an AGV. Moving the kinematic plate 13 towards the port door allows the port door to couple with and remove the port door to provide access to the wafers stored within the FOUP. Neither the FOUP advance plate assembly 12 nor the kinematic plate 13 move vertically. Thus, a floor-based transport system must have an apparatus (e.g., robotic arm) for loading and unloading the FOUP from the kinemtaic plate 13.

FIG. 4 illustrates a conventional floor based transport system, such as an RGV, that travels along the facility floor on a railway system. The railway system (shown as outline 30) travels throughout the facility and eventually passes adjacent the housing 11 of a load port 10. The RGV, carrying a FOUP, stops in front of the load port 10 and places the FOUP onto the kinematic plate 13. The FOUP is then advanced towards the port door 14 whereby the port door 14 eventually removes the FOUP door.

FIG. 5 illustrates that a conventional load port 10 occupies an area in front of the tool 50 (shown as outline 18). The outline 18, which mostly consists of the housing 11, generally occupies a rectangular volume (width not shown in FIG. 5)—comprising a depth X2 outward from the front end 52 of the processing tool 50 and a vertical height X3. The AGV, in combination with the load port 10, extends outward from the tool 50 (e.g., X1+X2) and occupies a large footprint on the facility floor 4.

Figure 1:
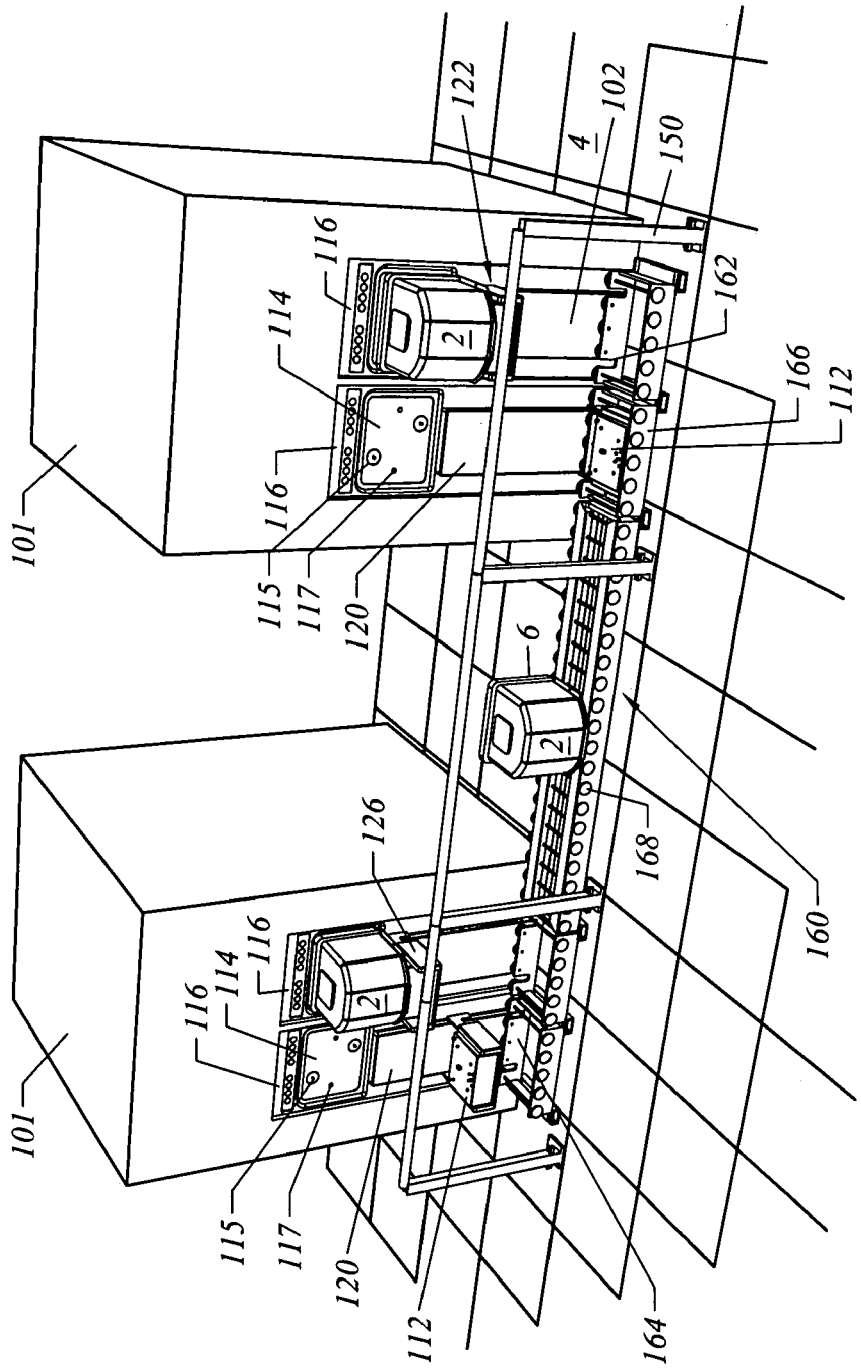
FIG. 1 is a perspective view of an embodiment of the present invention.
Figure 2A:
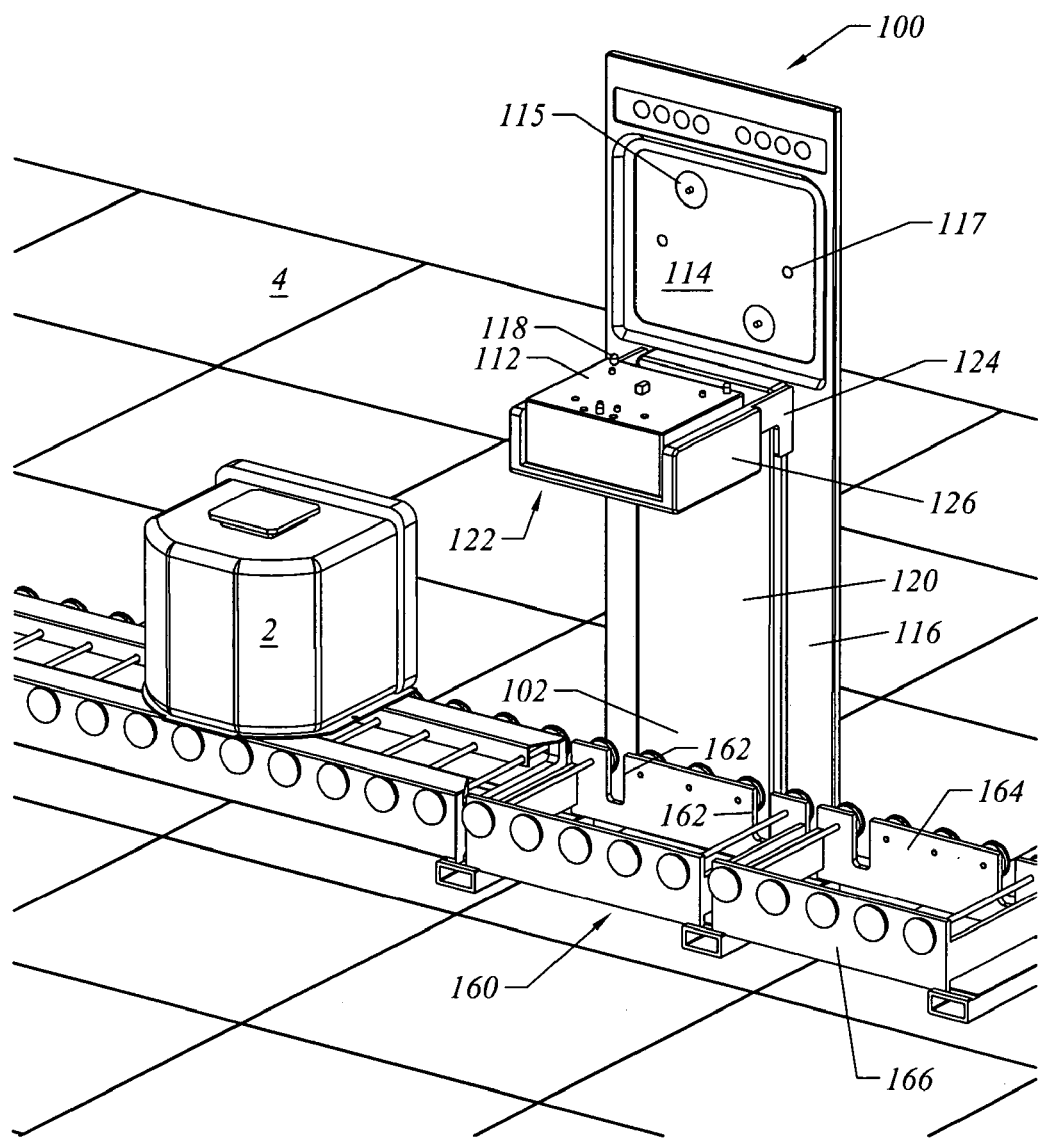
FIGS. 2A-2F are perspective views of the embodiment shown in FIG. 1, further illustrating a load port having a vertically movable FOUP advance plate assembly.
Figure 2B:
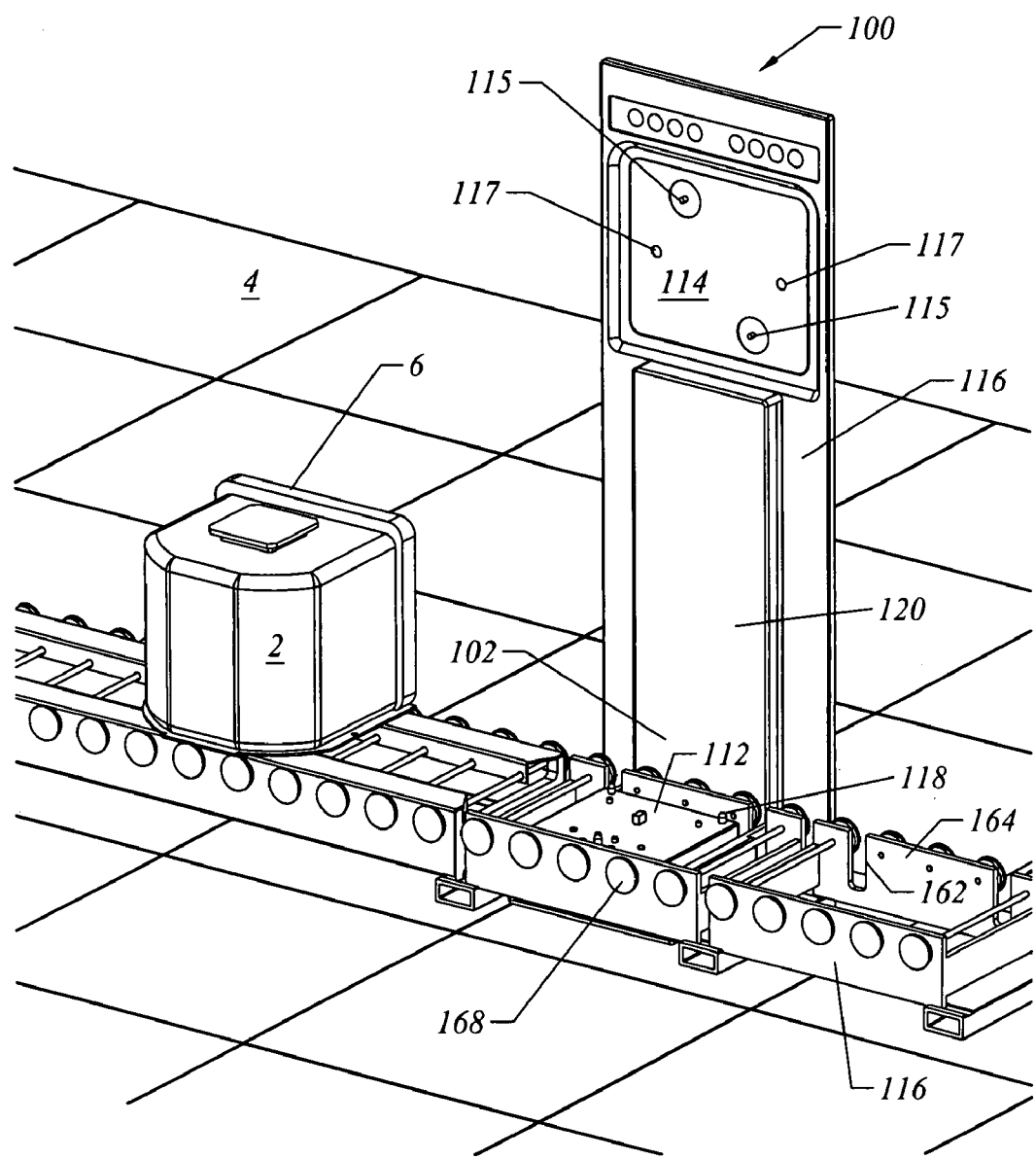
Figure 2C:
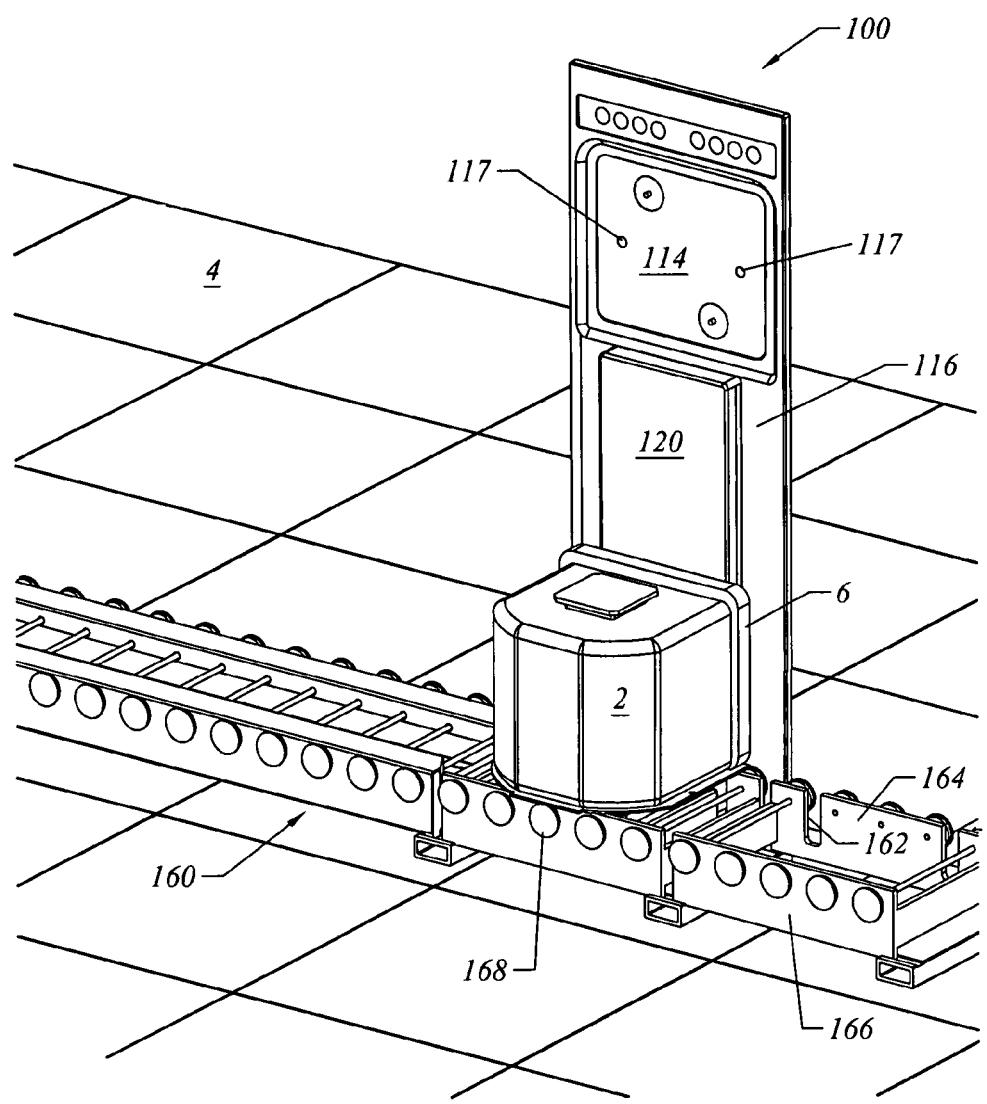
Figure 2D:
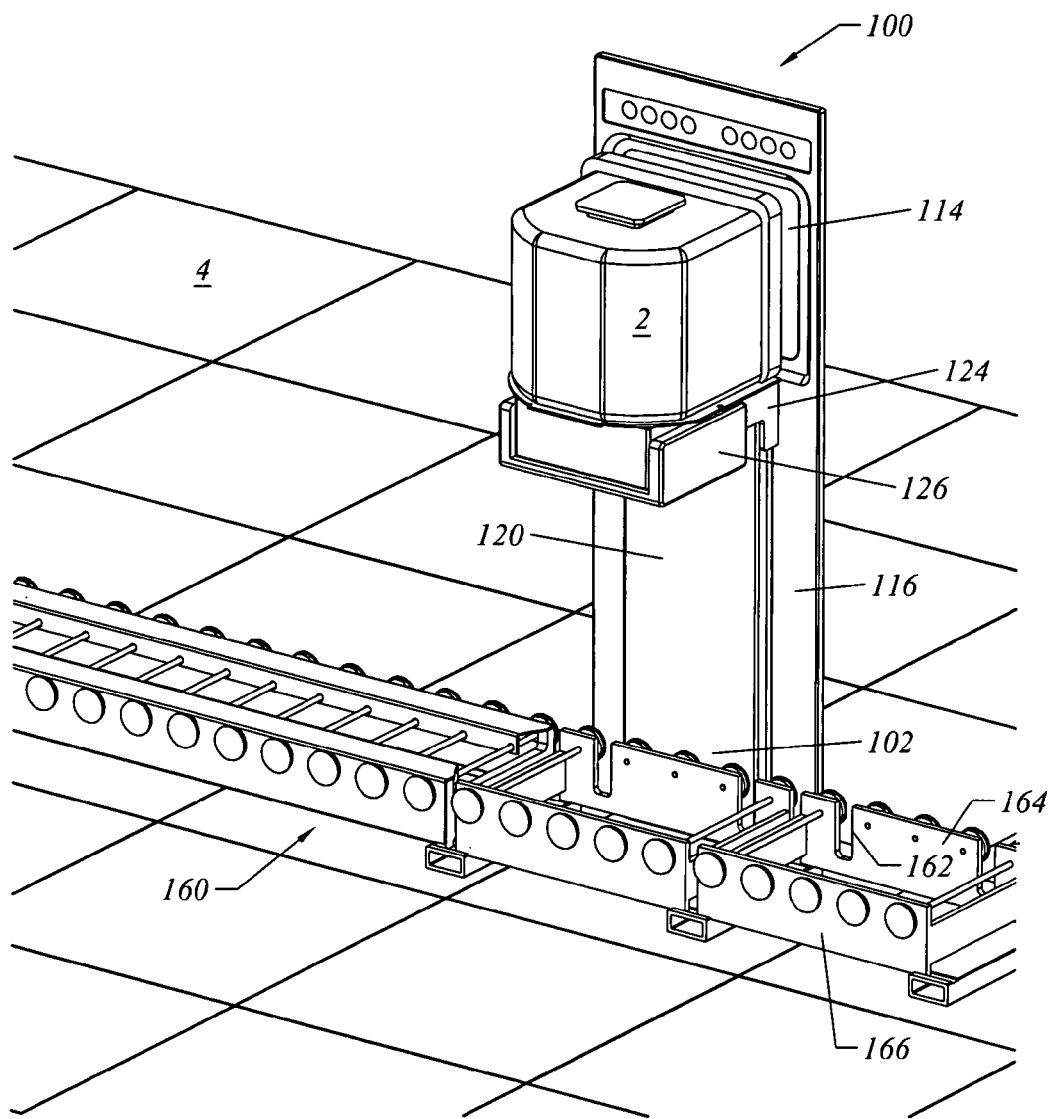
Figure 2E:
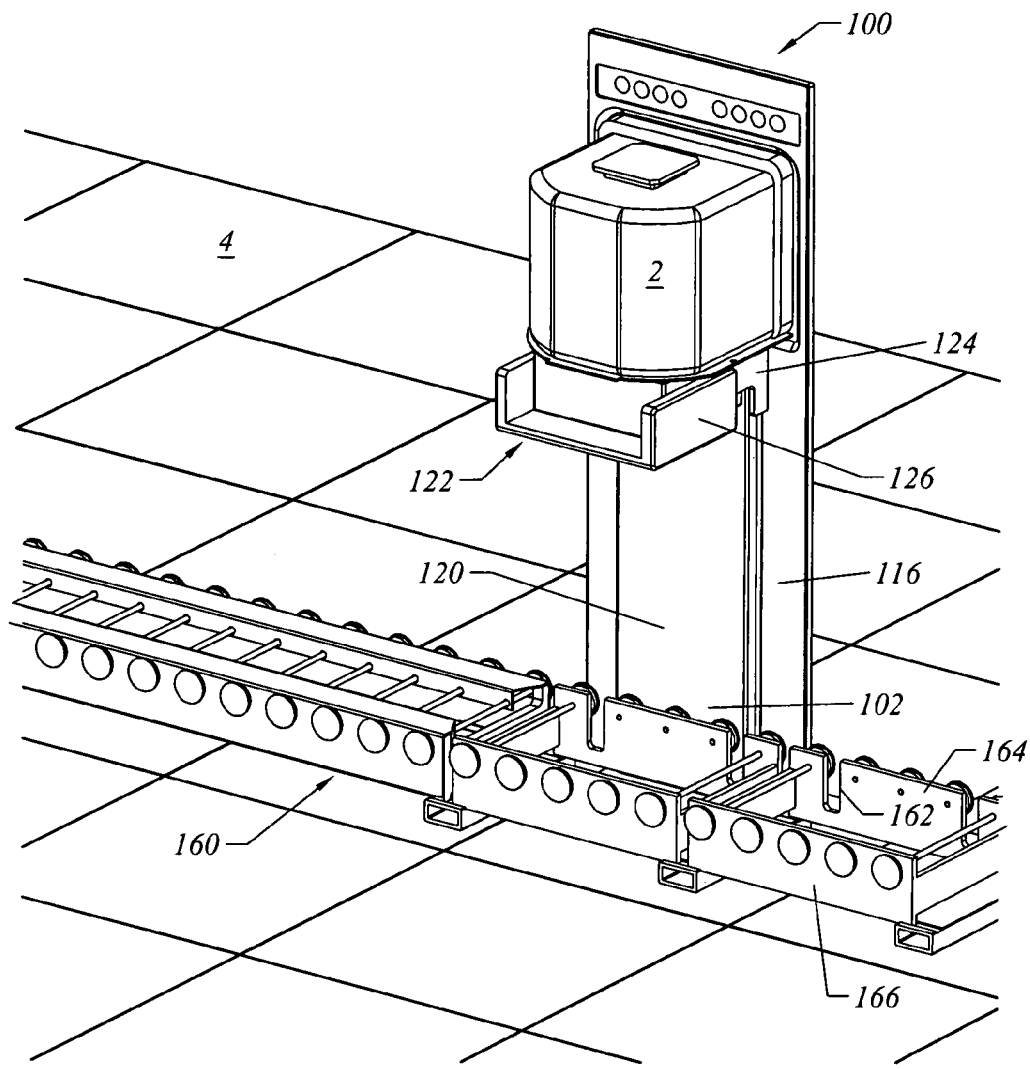
Figure 2F:
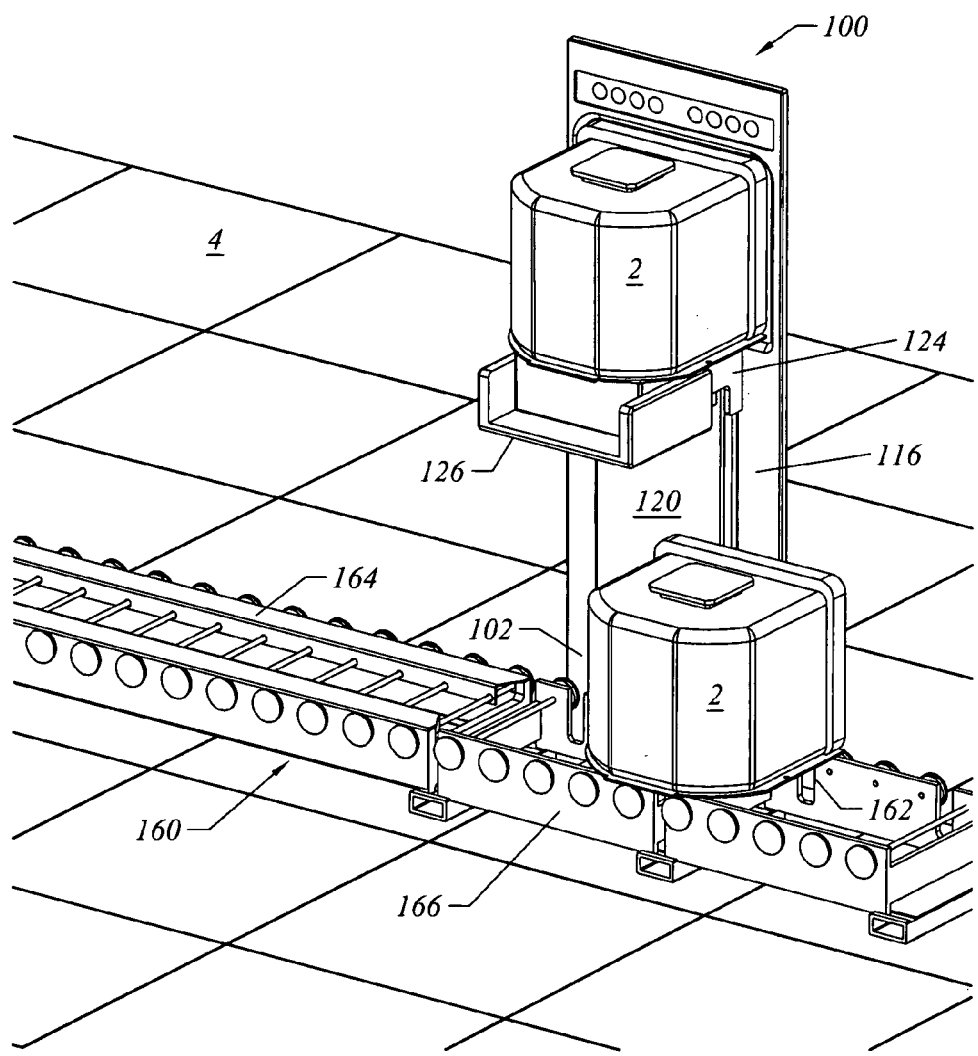
Figure 3:
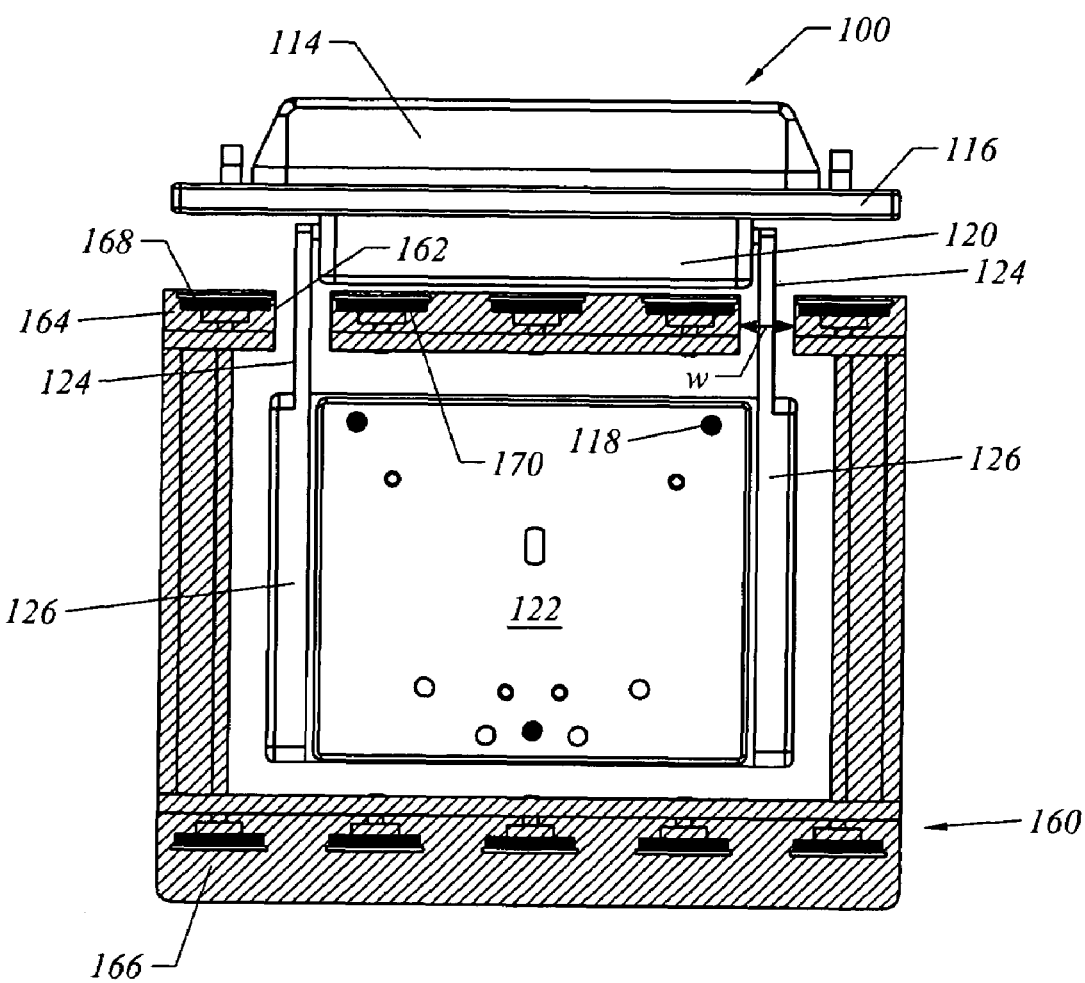
FIG. 3 is a top view of the embodiment of the present invention shown in FIGS. 2A-2F, further illustrating how the conveyor accommodates a FOUP advance plate assembly located in a lowermost position.

FIGS. 1-3 illustrate one embodiment of the present invention, which comprises a floor mounted conveyor 160 and a load port 100 having a vertically movable FOUP advance plate assembly 122. The conveyor 160 and load port 100 do not extend outward from the tool 101 any further than the conventional load port 10 extended outward from the tool by itself (e.g., X2). It is within the scope of the invention for the conveyor 160 to extend outward from the tool 101 further than the FOUP advance plate assembly 122. The term "conveyor" means an apparatus that conveys, such as a mechanical apparatus that transports materials, packages, or items from one place to another. By way of example only, the articles may be moved along the conveyor 160 by rollers, air track, railway, belt(s) or any other means known within the art.

The load port 100 includes, among other things, a kinematic plate 112, a port door 114, a mounting plate 116 and a FOUP advance plate assembly 122. The mounting plate 116 preferably secures to a tool 101 through either a BOLTS Interface or the proposed SEMI BOLTS-Light Interface (discussed later in application) and has an opening. The kinematic plate 112 preferably includes three kinematic pins 118 and an active container hold down mechanism (in compliance with SEMI Standard E15.1). The port door 114 moves between an open and closed position. By way of example only, the port door 114 comprises a Front Opening Interface Mechanical Standard (FIMS) door assembly. In this embodiment, the FIMS door 114 includes a pair of vacuum cups 115 and a pair of latch keys 117. The latch keys 117 open and close the FOUP door. The vacuum cups 115 evacuate the area between the FOUP door and the port door when the two doors are coupled together. The FIMS door 114 is not limited to the example shown in FIG. 1 and may include other features. In addition, it is within the scope of the invention for the load port 100 to not have a port door 114.

The FOUP advance plate assembly 122 includes a drive 126 for moving the kinematic plate 112 horizontally. The kinematic plate 112 supports the bottom surface of a FOUP and aligns the FOUP with respect to the opening in the mounting plate 116. The drive 126 moves the kinematic plate 112 between a first position (see FIGS. 2A-2D) and a second position (see FIGS. 2E-2F). In the first position, an OHT system may load or unload a FOUP 2 from the kinematic plate 112. The first position also places the kinematic plate 112 in a load/unload position for placing and removing a FOUP 2 from the conveyor or other transport device. The FOUP advance plate assembly 122 may move the kinematic plate 112 to the first position before the z-drive 120 lowers the FOUP advance plate 122 to the conveyor 160 or the kinematic plate 112 may move horizontally while the FOUP advance plate assembly 122 moves vertically.

It is also within the scope of the invention for the kinematic plate 112 to not move horizontally at all. For example, after the FOUP advance plate assembly 122 is raised vertically, the port door 114 may move horizontally towards the FOUP door to uncouple and remove the FOUP door. Or a port door may not be required at all if the container does not have a mechanically openable door. In this case, a container may be raised from the conveyor to a height where the tool can access the article.

FIG. 2A illustrates that, in one embodiment, a pair of supports 124 connect the FOUP advance plate assembly 122 to a z-drive mechanism 120. The present invention is not limited to the supports 124 shown in FIG. 2A. In fact, any support mechanism that connects the FOUP advance plate assembly 122 to the z-drive mechanism 120 will suffice. By way of example only, a single support may connect the FOUP advance plate assembly 122 to the z-drive mechanism 120. The supports 124 may be connected to the FOUP advance plate assembly 122 and the z-drive mechanism 120 by any structure known within the art. The z-drive mechanism 120 may comprise any drive assembly known within the art.

The load port 100 does not include a housing located below the FOUP advance plate assembly 122 similar to a conventional load port (e.g., housing 11 of load port 10). The area between the FOUP advance plate assembly 122 and the facility floor 4 is therefore cleared of obstructing components. In other words, the FOUP advance plate assembly 122 is able to move substantially vertically and parallel to the mouting plate 116. For purposes of describing the invention, the FOUP advance plate assembly 122 moves vertically between an uppermost height (see FIG. 2A) and a lowermost height (see FIG. 2B). The FOUP advance plate assembly 122 is able move to any position between these two heights. It is also within the scope of the invention for the FOUP advance plate assembly 122 to move between other heights (e.g., above the opening in the mounting plate 116).

To pick up a FOUP 2 off the conveyor 160, the FOUP advance plate assembly 122 is placed in the lowermost position. To do so, the z-drive mechanism 120 lowers the FOUP advance plate assembly 122 to the position is shown FIG. 2B. The FOUP advance plate assembly 122, while located in the lowermost position, is preferably situated between the first rail 164 and the second rail 166 of the conveyor 160. The FOUP advance plate assembly 122 must be lowered enough so that a FOUP 2 traveling along the conveyor 160 may pass unobstructed over the kinematic plate 112. In this embodiment, the kinematic plate 112 is moved to a forward position (away from port door) to fit between the rails 162, 164.

FIG. 2C illustrates a FOUP 2 that has come to a complete stop on the conveyor 160 over the kinematic plate 112. The FOUP 2 preferably comes to rest over the kinematic plate 112 when the kinematic pins 118 align with the pin receptacles on the bottom surface of the FOUP 2. While the FOUP 2 and kinematic plate 112 are aligned, z-drive 120 raises the FOUP advance plate assembly 122. The kinematic plate 112 eventually contacts the bottom surface of the FOUP 2 and lifts the FOUP 2 off the conveyor 160 as the z-drive 120 continues to raise the FOUP advance plate assembly 122 towards the uppermost position (see FIG. 2D). No further adjustment between the FOUP 2 and the kinematic plate 112 are necessary in order to access wafers in the FOUP.

The conveyor 160 shown in FIGS. 2A-2C transports the FOUP 2 so that the FOUP door faces the load port when the FOUP arrives at the load port. It is within the scope and spirit of the invention to transport the FOUP along the conveyor in other orientations. By way of example only, the FOUP may travel along the conveyor with the FOUP door facing the direction the FOUP is moving. In this situation, the FOUP advance plate assembly 122, after it picks up a FOUP 2 from the conveyor 160, rotates the FOUP 2 ninety degrees so that the FOUP door faces the load port.

At this point, the FOUP advance plate assembly 122 moves the kinematic plate 112 towards the port door 114. The FOUP is moved forward until the port door is close enough to the FOUP door to uncouple and remove the FOUP door. By way of example only, a port door that is able to unlock and remove the FOUP door and transport the FOUP and port door within the tool is described in U.S. Pat. No. 6,419,438, entitled "FIMS Interface Without Alignment Pins," which is assigned to Asyst Technologies, Inc., and is incorporated herein by reference. FIG. 2F illustrates that additional FOUPs in the fabrication facility travel unobstructed along the conveyor 160 to another processing tool while the wafers within the FOUP 2 located on the kinematic plate 112 are being processed.

A FOUP 2 travels along the first and second rails 164, 166 of the conveyor 160. FIG. 3 illustrates that the rails are preferably spaced apart to accommodate the FOUP advance plate assembly 122 while located in the lowermost position, between the rails. In the FIGS. 1-3 embodiment, each section of the conveyor 160 located in front of the load port 100 includes two slots 162 in the first rail 164. Each slot 162 allows a support 124 to pass through the first rail 164 as the FOUP advance plate assembly 122 is lowered to the lowermost position (see FIG. 2B). The slots 162 allow the z-drive 120 to lower the kinematic plate 112 to a position where a FOUP 2 traveling along the conveyor 160 can pass over the kinematic plate unobstructed. Any modification to the first rail 164 that accommodates a support 124 is within the spirit and scope of this invention. Similarly, if the load port 100 only includes one support 124, the rail 164 only requires one slot 162.

FIGS. 1-2 illustrate several features of a floor mounted conveyor 160. It is within the scope of the present invention to place the conveyor at any height within the fabrication facility. By way of example only, the conveyor 160 may be located below the facility floor 4 (e.g., FIG. 11), flush with the facility floor 4 (e.g., FIG. 10) or above the load port (not shown).

Regardless of the height of the conveyor system relative to the load port, each FOUP 2 preferably travels along the conveyor 160 such that the FOUP door 6, when the FOUP 2 arrives at the load port 100, faces the port door. However, a FOUP may travel along the conveyor in other orientations and can eventually be rotated to face the port door. Either way, the number of times each FOUP 2 is handled between the conveyor and the load port is greatly reduced. For example, after a FOUP is lifted off the conveyor by the FOUP advance plate assembly, the FOUP does not have to be aligned again prior to accessing the wafers. The FOUP is lifted off the conveyor and does not have to be handled by a robotic arm (e.g., required in an RGV system). The load port 100 eliminates this additional handling step, which provides faster transfer of FOUPs from a conveyor or other transport device to a load port and minimizes handling of the FOUP 2.

Conventional load ports do not allow a floor based FOUP transport system to transport FOUPs directly below the FOUP advance plate assembly 122. The housing 11 occupies the entire space between the FOUP advance plate assembly and the facility floor 4. FIGS. 8-11 provide examples of FOUP transport systems for use with the load port 100 according to the present invention. However, other FOUP transport systems are within the spirit and scope of this invention.

Figure 8:
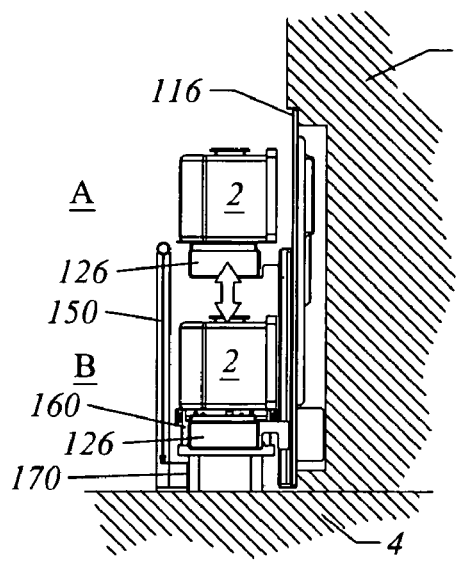
FIG. 8 is a plan view of another embodiment of the present invention, illustrating an embodiment of a conveyor system.

FIG. 8 illustrates a conveyor 160 raised above the facility floor 4. This conveyor 160 provides room for a SEMI specified PGV docking area "toe kick" 170 at each load port. This conveyor 160 minimizes the z-stroke required to move a FOUP 2 between the conveyor 160 (position B) and the uppermost position of the FOUP advance plate assembly 122 (position A). The conveyor installation is simple because the facility floor 4 stays in place and there is no required alignment with floor tiles.

Figure 9:
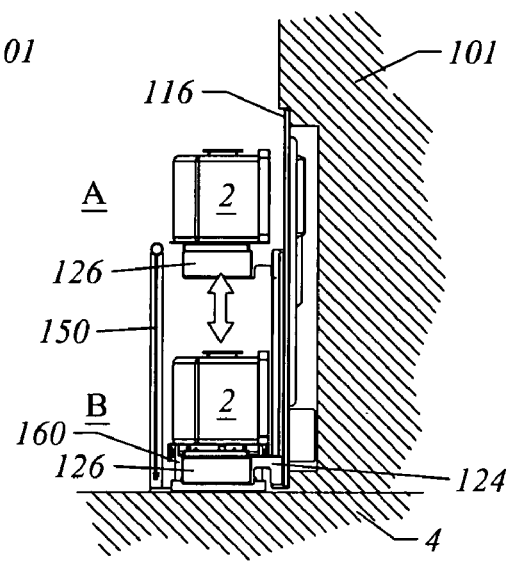
FIG. 9 is a plan view of yet another embodiment of the present invention, illustrating the system having a floor mounted conveyor system.

FIG. 9 illustrates a low-profile conveyor 160. This low-profile conveyor 160 makes it easier to have step-over areas for tool operators. FOUPs are moved between position A and position B as described above. The step-over areas allow operator foot traffic to pass over the conveyor 160 where, for example, the fence or rail 150 has a portion missing (see FIG. 1). The low-profile conveyor also makes it easier for an operator to lift a load port 100 over the conveyor, for example, to service the load port 100.

Figure 10:
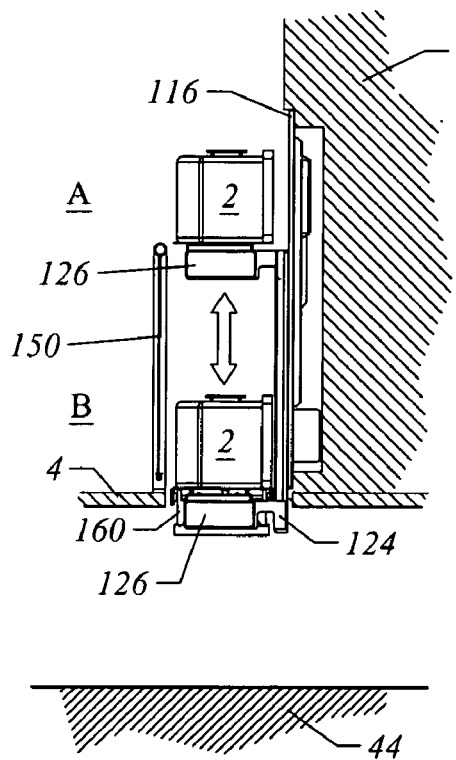
FIG. 10 is a plan view of still another embodiment of the present invention, illustrating the system having a conveyor embedded in the facility floor.

FIG. 10 illustrates a conveyor 160 embedded into the facility floor 4. In this embodiment, the bottom surface 3 of a FOUP 2 travels along the conveyor 160 substantially at floor level. The conveyor 160 does not obstruct access to the front of the load port 100. In comparison to the conveyors shown in FIGS. 8-9, the z-stroke requirement between the conveyor 160 (position B) and the uppermost position (position A) is increased and the floor 4 must be modified to allow room for the conveyor 160. However, this embedded conveyor 160 provides several advantages. The wheels of the conveyor 160 could, for example, retract lower into the facility floor 4 in sections located between processing tools 101—allowing foot traffic to easily walk over the conveyor 160 or allow equipment to be rolled over the conveyor 160. Alternatively, a temporary plate could be placed over the conveyor 160 with clearance for the wheels that would allow foot traffic and easier equipment roll in.

Figure 11:
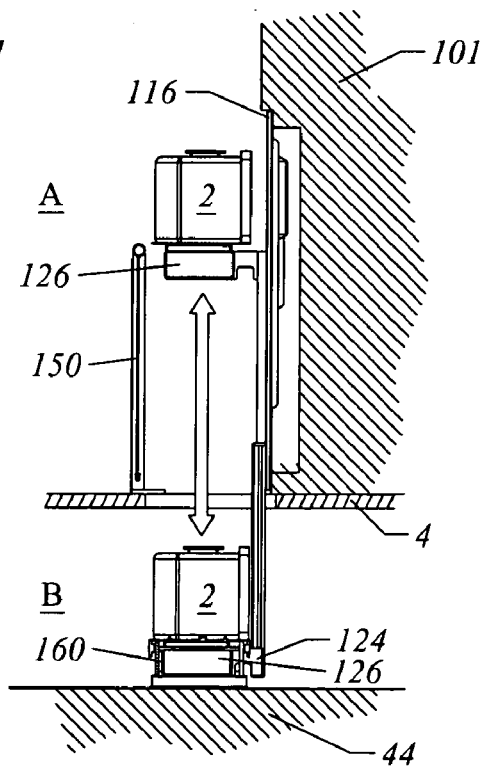
FIG. 11 is a plan view of yet another embodiment of the present invention, illustrating a sub-floor conveyor system.
Figure 12:
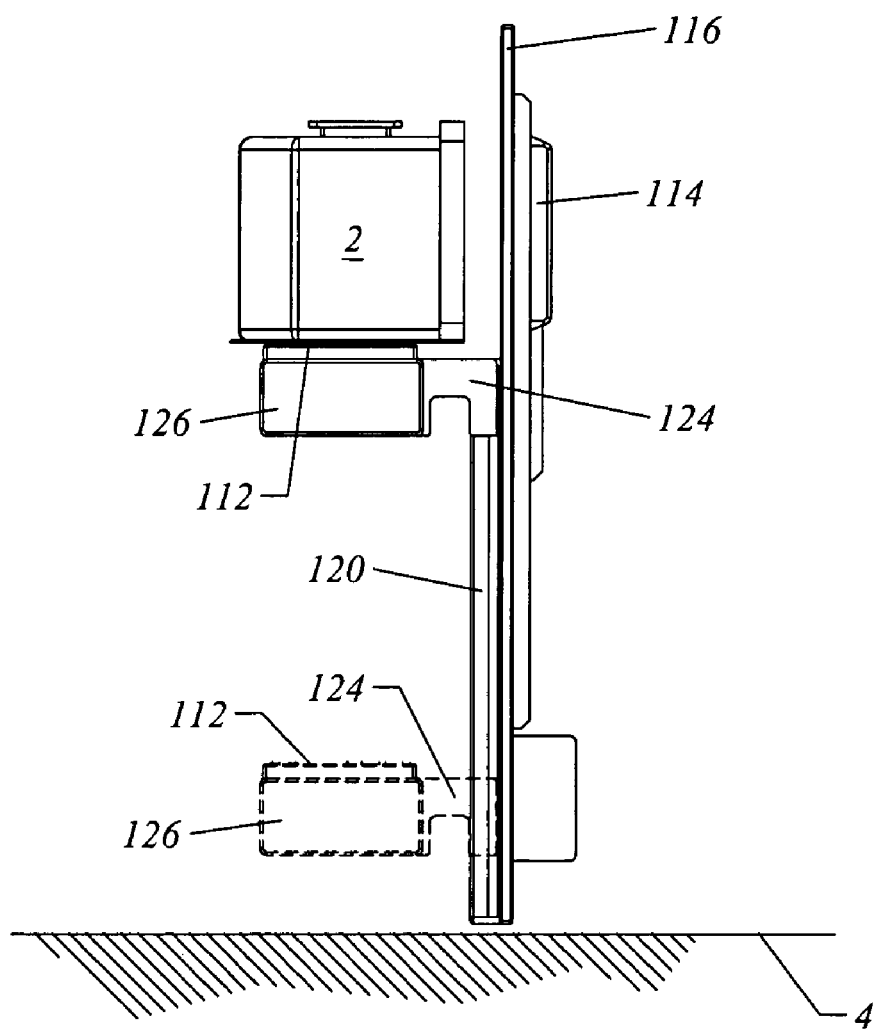
FIG. 12 is a plan view of an embodiment of the present invention, illustrating a range of motion of the load port.

FIG. 11 illustrates a conveyor 160 located below the facility floor 4. This embodiment allows foot traffic and equipment roll-in to occur completely unobstructed by the conveyor 160. The z-stroke requirement between the conveyor 160 (position B) and the uppermost position (position A) is much greater in this embodiment than the conveyors shown in FIGS. 8-10.

FIGS. 13-16 illustrate an embodiment of a two-stage "telescoping" z-mechanism 220 for moving the FOUP advance plate assembly 222 between position A and position B for use with a conveyor located below the facility floor (see FIG. 11). The retracted mechanism 240 is preferably located above the facility floor 4 when it is in a retracted position. This feature allows for easier removal of the load port 200. The telescoping z-mechanism 220 could also be used in a fabrication facility having a floor mounted conveyor 160 as long as the second z-guide 242 is not operated. Similar to the load port 100, the FOUP advance plate assembly 222 can be raised to position A, allowing a FOUP to travel along the conveyor 160 and pass underneath the FOUP advance plate assembly 222.

Figure 13:
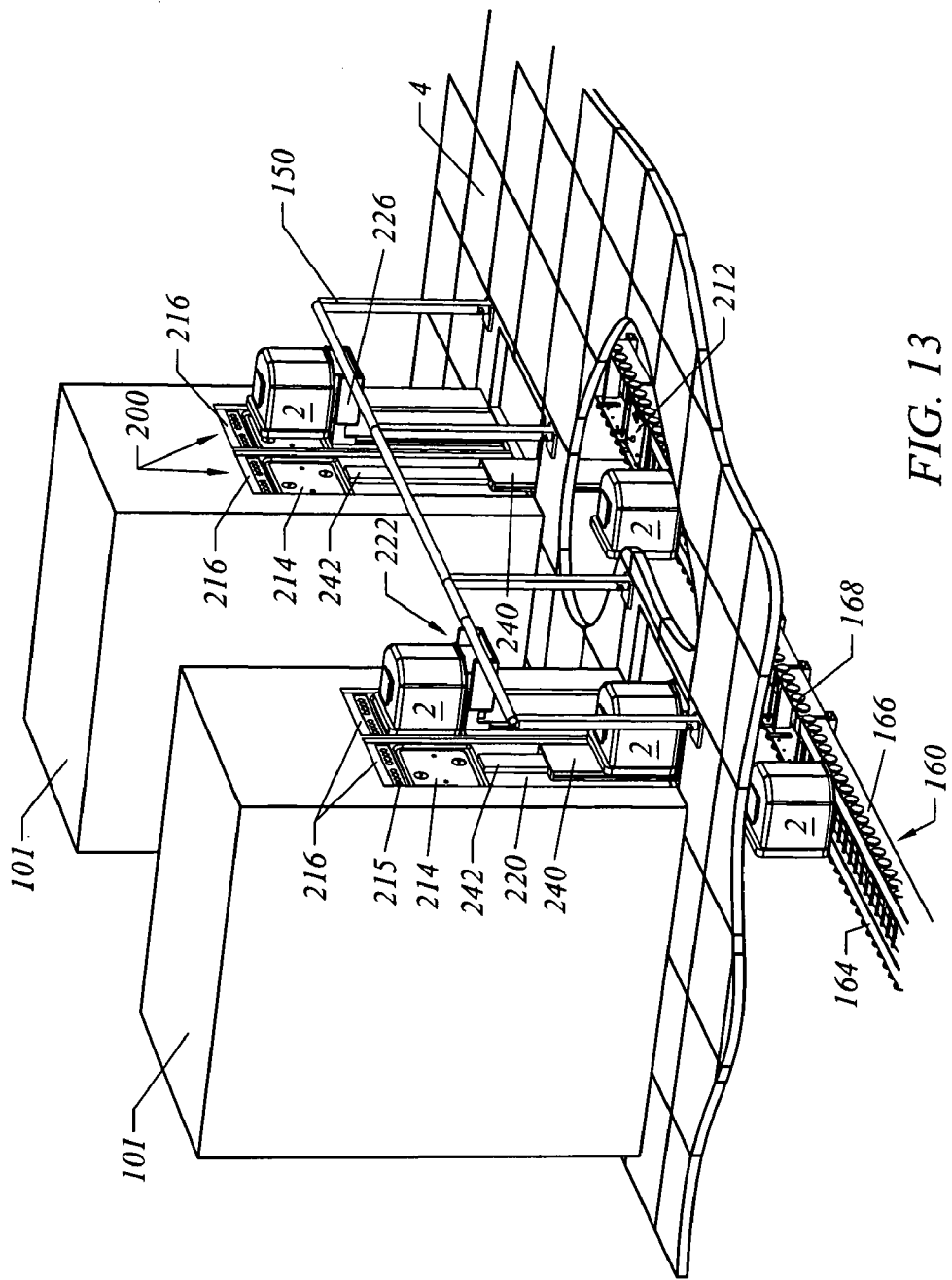
FIG. 13 is a perspective view of another embodiment of the present invention.
Figure 14:
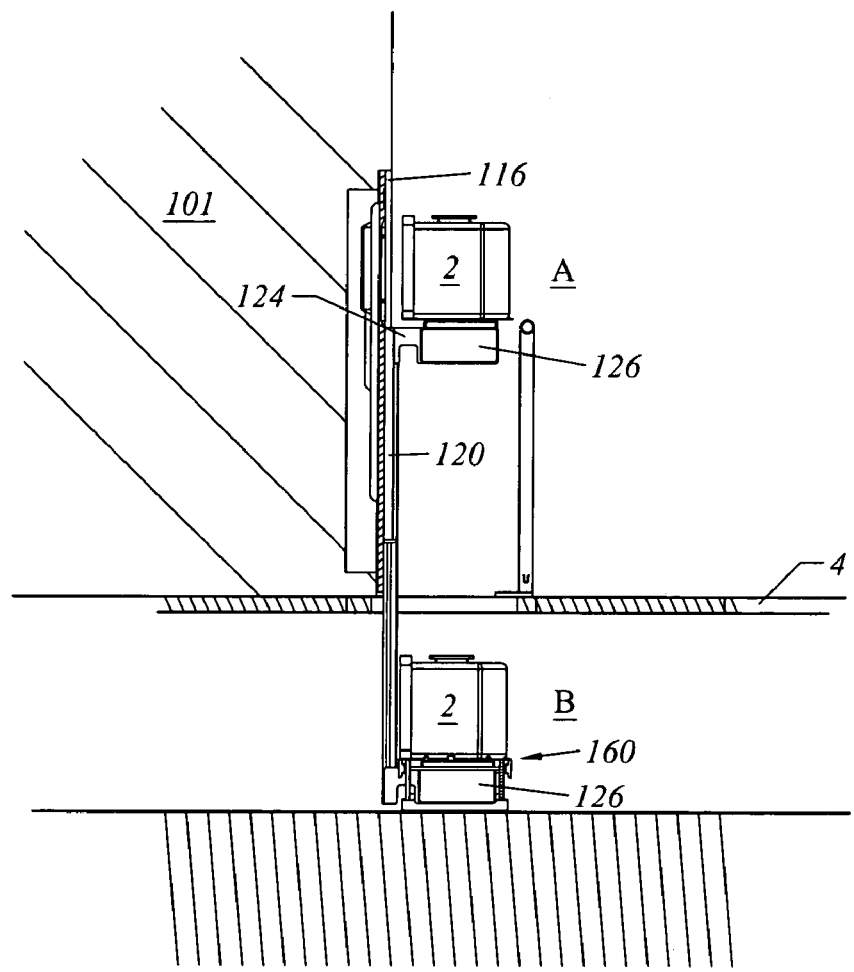
FIG. 14 is a plan view of an embodiment of the present invention, illustrating the system shown in FIG. 13.
Figure 15:
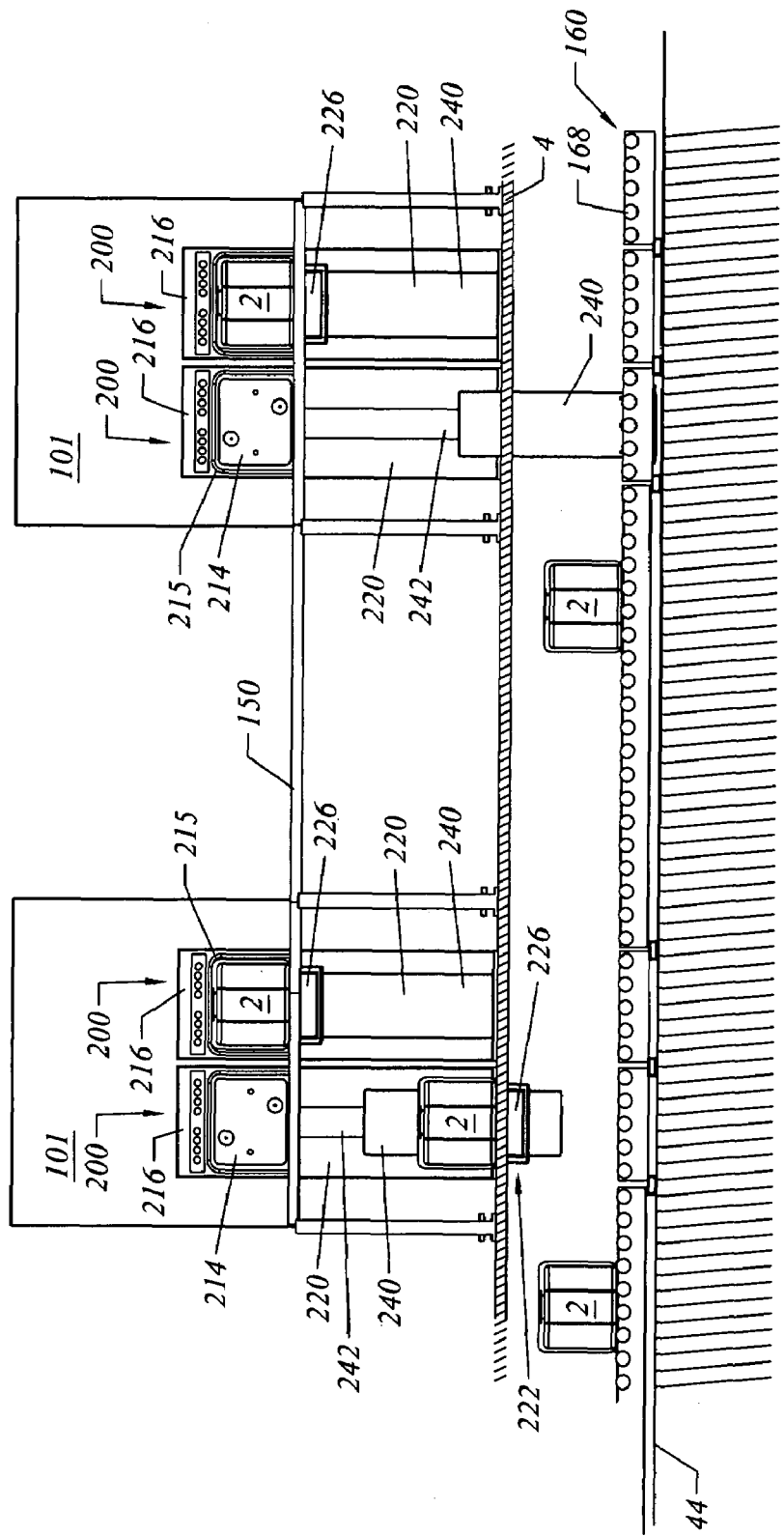
FIG. 15 is a front view of an embodiment of the present invention, illustrating the system shown in FIG. 13.

FIGS. 13-15 illustrate two processing tools 101. Each tool 101 includes two load ports 200. Similar to previous load ports described above, each load port includes a mounting plate 216 having an I/O port 215, a port door 214, and kinematic plate 212 and a z-drive mechanism 220. The z-drive mechanism 220 moves the FOUP advance plate assembly 222 vertically between the I/O port 215 and the conveyor 160. The z-drive mechanism 220 comprises a two-stage mechanism having a first stage drive mechanism (FSD) 240 and a second stage drive mechanism (SSD) 242. The FSD 240 moves the FOUP advance plate assembly 222 vertically between the I/O port 215 and the facility floor 4. The SSD 242 includes a drive assembly that moves the FSD 240 vertically between the facility floor 4 and the I/O port 215. In one embodiment, the SSD 242 sits within a back channel 250 of the FSD 240 and provides a guide for the FSD 240. The present invention is, however, not limited to this structure. When the FSD 240 is located in its fully raised position, the FSD 240 preferably does not extend below the mounting plate 216. This feature allows the load port 200 to be easily removed from the tool 201.

Figure 16:
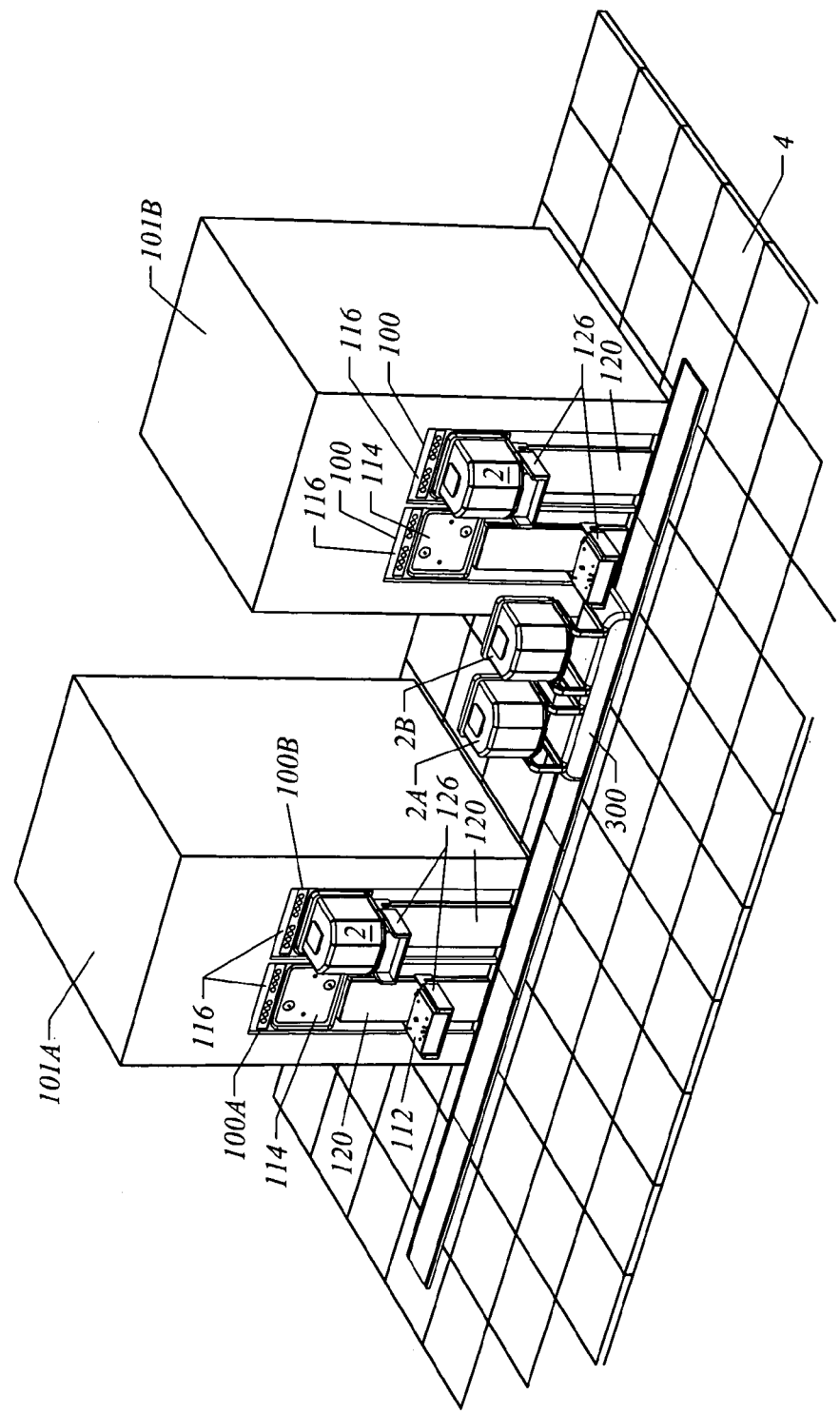
FIG. 16 is a perspective view of another embodiment of the present invention, illustrating a container transport system isolated from the facility.
Figure 17:
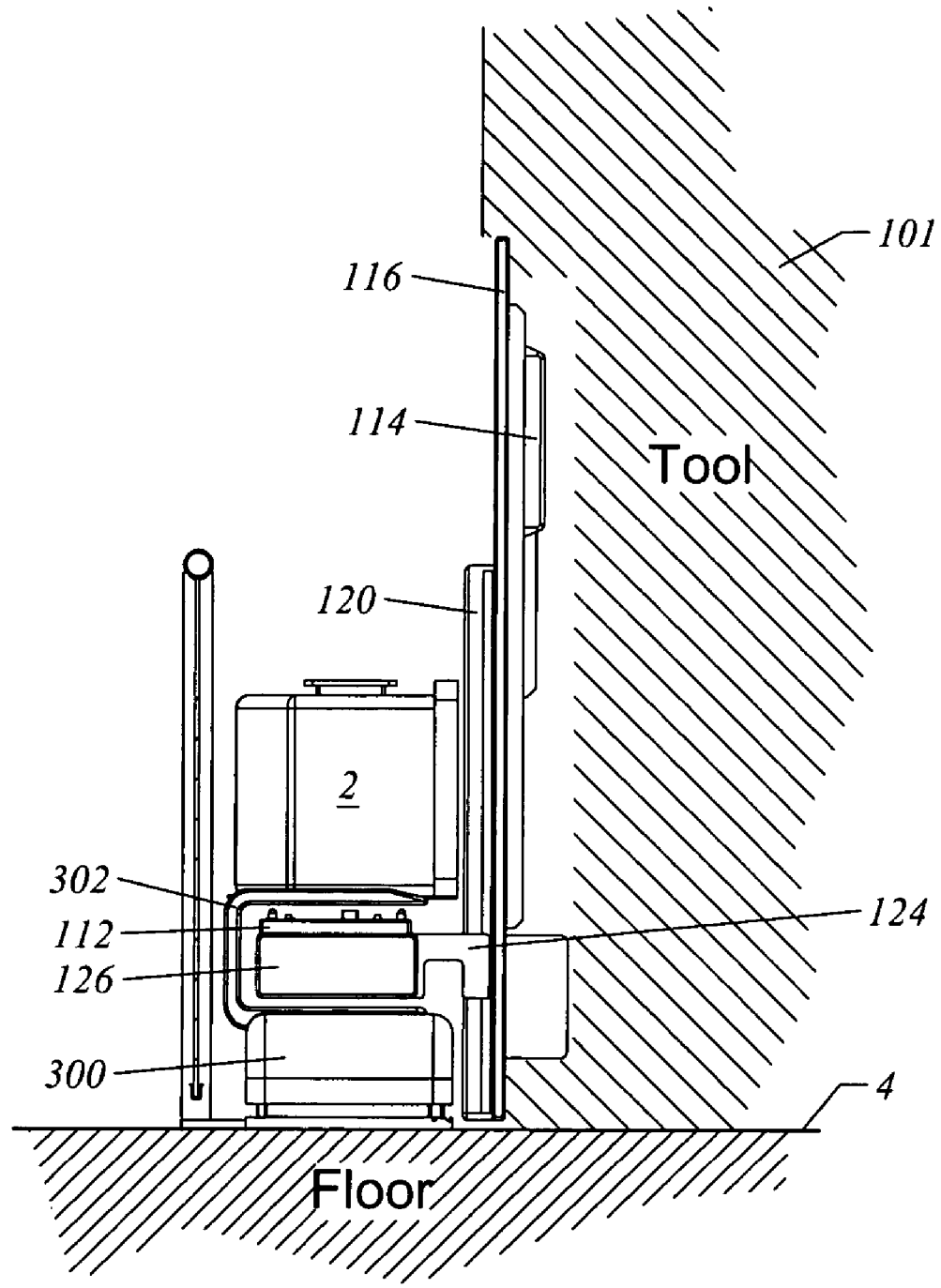
FIG. 17 is a perspective view of another embodiment of the present invention, illustrating a two-stage reduced height vertical drive.

FIGS. 16-17 illustrate the load port 200 with a reduced height mounting plate 216. The reduced height mounting plate 216 secures to a processing tool 101 through a BOLTS Interface similar to the mounting plate 116 described above. However, this mounting plate 216 does not extend down to the facility floor 4 when secured to the tool. Instead, a gap is left between the bottom of the plate 216 and the facility floor 4. The gap provides an access port to service the tool without having to remove the entire load port 200 from the tool. The access port would normally be covered by a blank plate (not shown) secured to the tool to prevent particulates from entering into the tool through the access port during operation. The blank plate can be removed whenever access to the tool is required. The reduced height mounting plate 216 also allows an operator to remove the load port from the tool and lift the load port over the floor-based transport system. For example, the mounting plate 216 can be removed from the tool while leaving the blank plate secured to the tool—making the load port lighter to handle.

FIG. 16 further illustrates that the containers may be transported throughout the facility within a tunnel 190. The tunnel 190 preferably includes access ports that allow the FOUP advance plate assembly 122 to be lowered through the access port and into the tunnel 190 in order to obtain a FOUP. It is within the scope of the invention for the tunnel 190 to also include vertical sections that would encompass the vertical travel path of the FOUP advance plate assembly 122. These vertical sections would provide beneficial for transport systems transporting open containers or cassettes throughout the facility. In this embodiment, the entire travel path of a container would be isolated from the rest of the facility. Vertical tunnel sections transporting open containers could also incorporate article mapping functions. For example, a vertical tunnel section could include an optical scanning assembly that determines the position of each wafer in the container as the container if lifted by the vertically movable support plate towards the opening.

Figure 18:
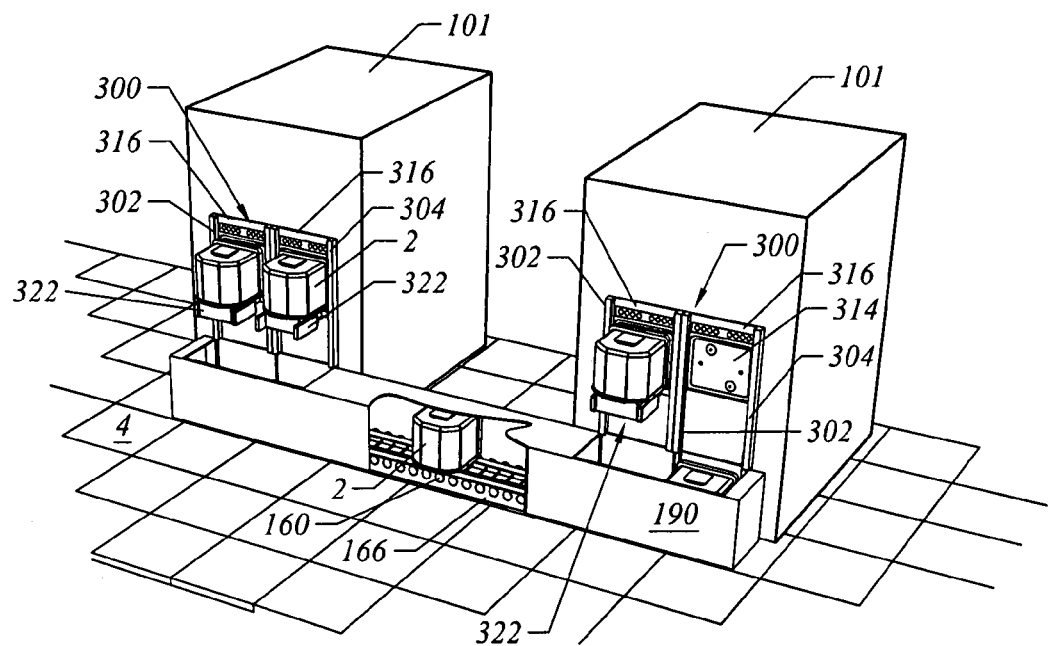
FIG. 18 is a perspective view of another embodiment of the present invention, illustrating a yet another embodiment of a load port.
Figure 19:
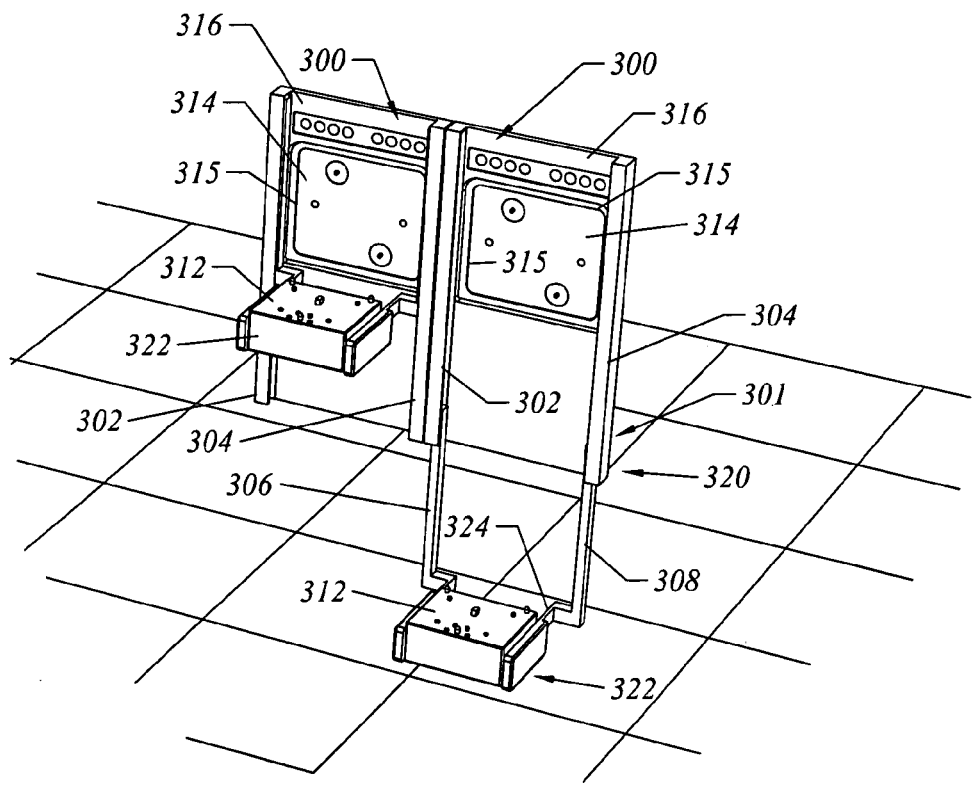
FIG. 19 is a perspective view of the load port shown in FIG. 18.
Figure 20:
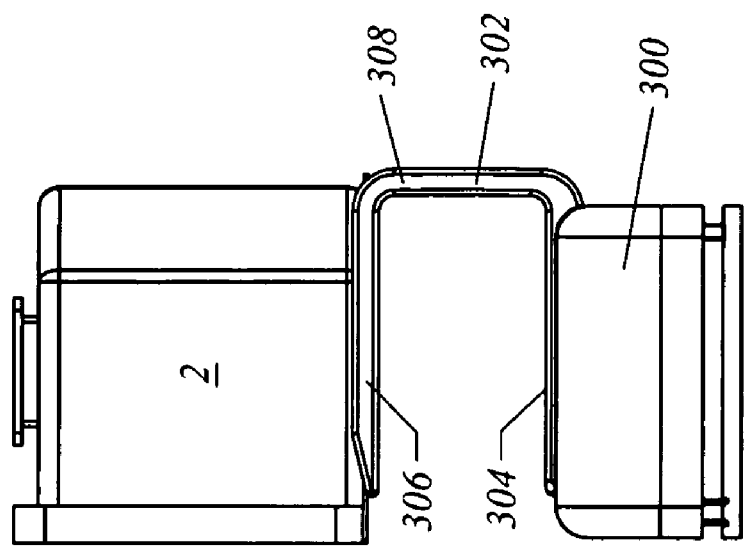
FIG. 20 is a perspective view of another embodiment of the present invention, illustrating an embodiment of a wafer shuttle for moving FOUPs between two tools.
Figure 21:
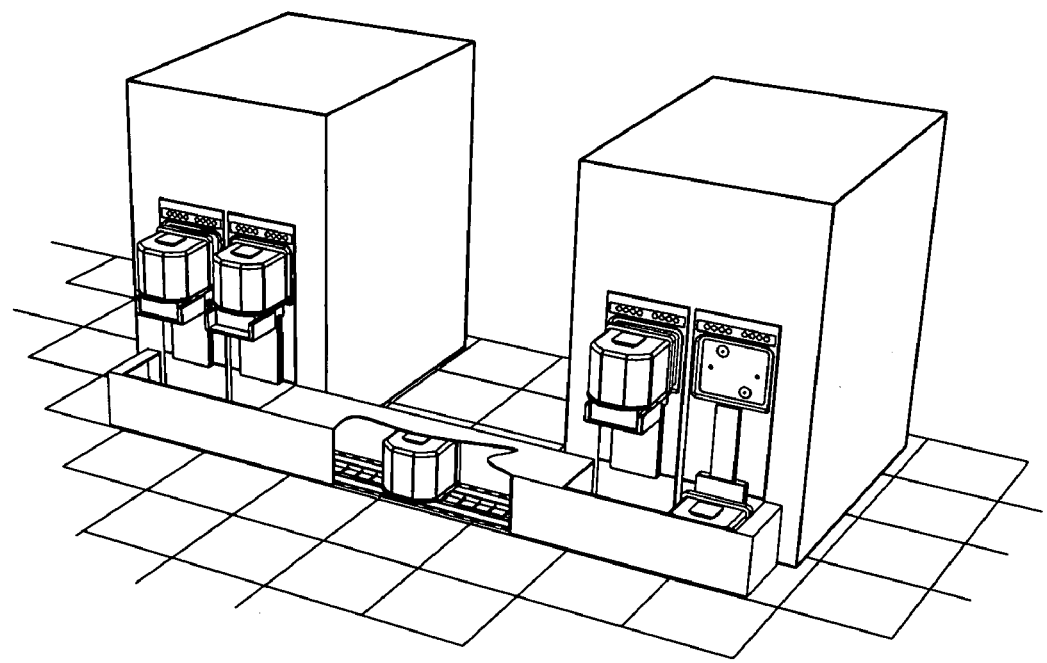
FIG. 21 is a plan view of the embodiment shown in FIG. 20.
Figure 22:
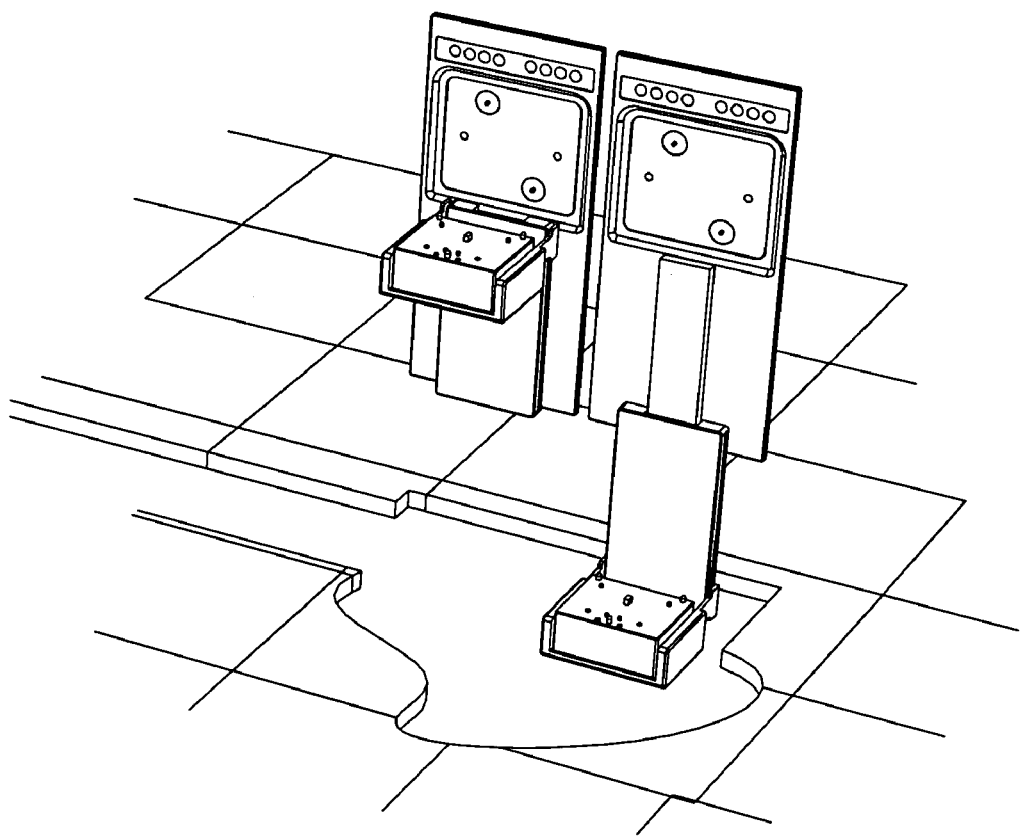
FIG. 22 is a perspective view of another embodiment of a wafer shuttle.
Figure 23:
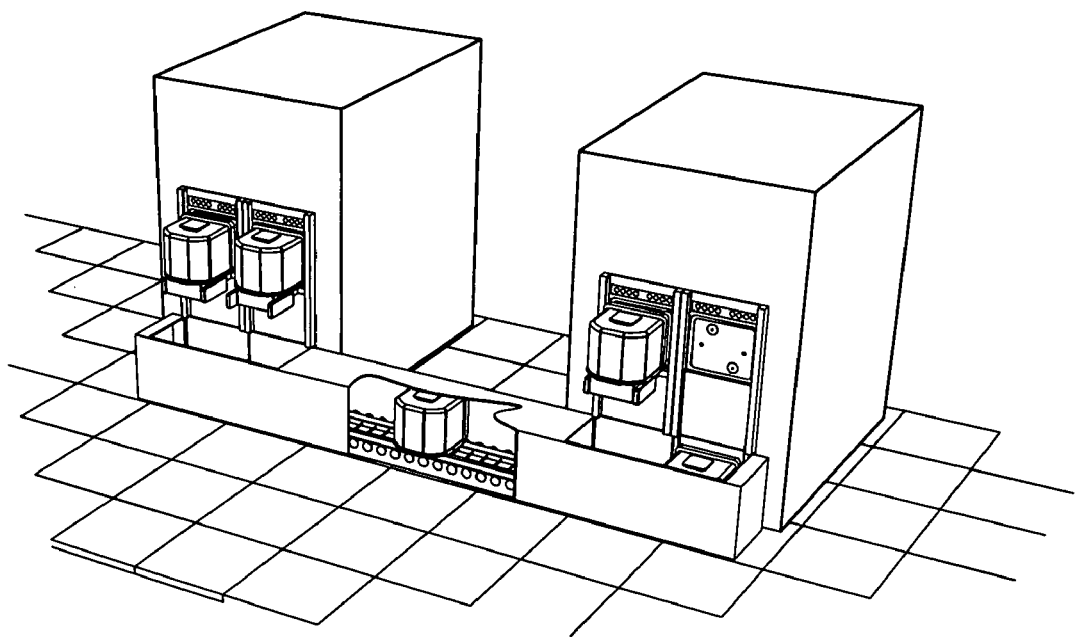
FIG. 23 is a front view of the wafer shuttle shown in FIG. 22.
Figure 24:
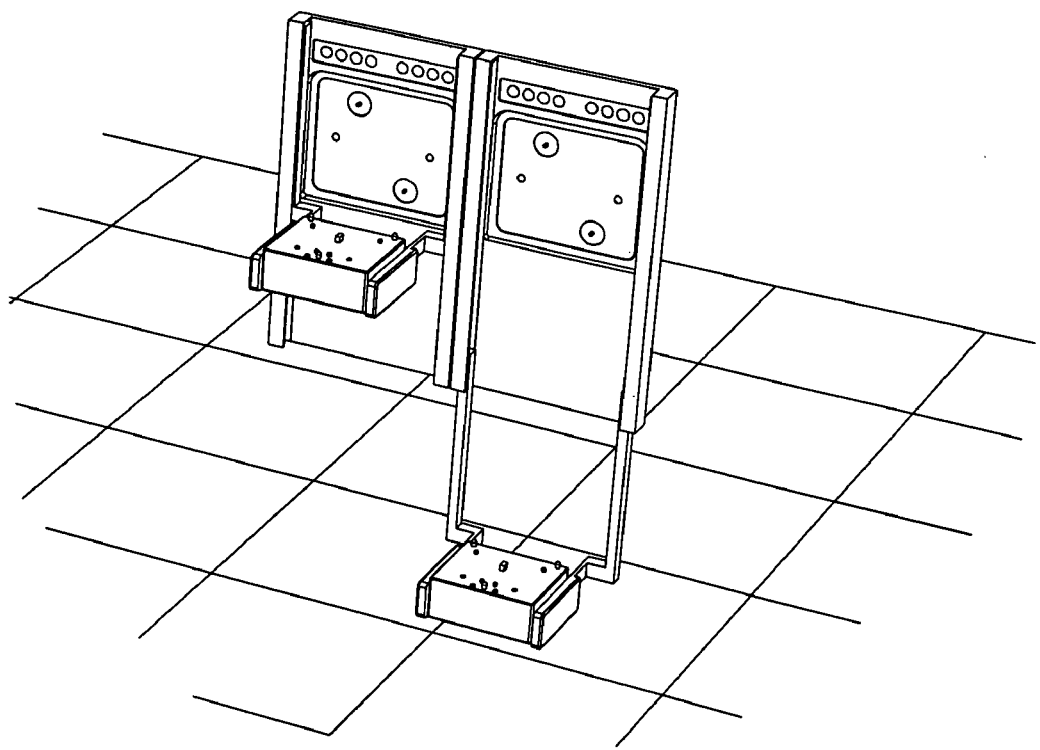
FIG. 24 is a plan view of the wafer shuttle shown in FIG. 22.

FIGS. 18-19 illustrate yet another embodiment of a load port having a FOUP advance plate assembly that moves vertically between an I/O port 315 and a conveyor 160 (or other FOUP transport device). In this embodiment, the load port 300 includes a FOUP advance plate assembly 322, a kinematic plate 312, a port door 314 and a mounting plate 316 having an I/O port 315. In this embodiment, the mounting plate 316 secures to the processing tool 101 through a BOLTS-Light interface.

The z-drive mechanism 320 moves the FOUP advance plate assembly 322 vertically between the I/O port 315 and the conveyor 160. The z-drive mechanism 320 includes a first z-guide 302 and a second z-guide 304. Each z-guide is secured to the mounting plate 316 on a side of the I/O port 315. Each z-guide may also be integrally formed with the mounting plate 316. The mechanism 320 also includes a pair of z-rails. In this embodiment, the first z-rail 306 travels within the first z-guide 302 and the second z-rail 308 travels within the second z-guide 304. At least one of the z-rails 306, 308 secure to the FOUP advance plate assembly 322. Thus, moving the rails 306, 308 vertically moves the FOUP advance plate assembly 322 between the I/O port 315 and the conveyor 160. The conveyor 160 is preferably modified (e.g., slots 162) to accommodate a FOUP advance plate assembly 322 located in the lowermost position. The load port 300 shown in FIGS. 18-19 lowers the FOUP advance plate assembly 322 to a floor mounted conveyor. The z-mechanism 301 could also be used to fit a longer travel stroke (for sub-floor conveyor applications) while keeping the z-guides 302, 304 and drive mechanism (not shown) above the facility floor 4 for ease of maintenance.

FIGS. 8-11 illustrate one embodiment of a barrier 150 that provides a physical structure between the conveyor and the rest of the facility. The barrier 150 prevents interference with FOUP movement along the conveyor 160. In another embodiment, the conveyor 160 is isolated from the facility by a tunnel 190 (FIG. 18). The tunnel 190 preferably includes an opening in the top surface of the tunnel 190 where the tunnel 190 is located adjacent a load port. The opening in the tunnel 190 allows the FOUP advance plate assembly access to a FOUP traveling on the conveyor 160.

These conveyors transport FOUPs throughout the semiconductor fabrication facility. In a preferred embodiment, each FOUP travels along the conveyor below each FOUP advance plate assembly 122 located at the uppermost position. Placing the transport device below each load port's datum plane minimizes the effect of particles generated by the conveyor 160.

FIGS. 20-24 illustrate one embodiment of a shuttle 400 for simultaneously supporting and transporting two FOUP along the railway 420. It is within the scope of the present invention for the shuttle 400 to hold more or less than two FOUPs. The shuttle 400, in this embodiment, includes two sets of supports 402, each supporting a single FOUP 2. Each support 402 preferably includes a lower support 404 separated from an upper support 406 by a vertical member 408. The upper and lower supports are separated so that a shuttle 400, passing a load port with the FOUP advance plate assembly 122 located in the lowermost position will pass the load port unobstructed. The upper supports 406 are intended to support the bottom surface of a FOUP with minimal contact.

The shuttle 400 also accommodates a FOUP advance plate assembly 122 moving vertically. For example, the upper supports 406 are preferably separated by a distance greater than the width of the FOUP advance plate assembly 122. When the shuttle 400 comes to rest in front of a load port, a FOUP advance plate assembly 122, located in the lowermost position, is situated between the upper support 406 and the lower support 404 and does not interfere with the vertical support 408.

In order to transfer a FOUP from the shuttle 400 to the kinematic plate 112 of the load port 100, the FOUP advance plate assembly 122 is first lowered to the lowermost position.

A shuttle 400 then comes to rest on the railway 420 in front of the load port 100. At this point, the kinematic pin grooves in the bottom surface of the FOUP 2 preferably align with the kinematic pins 118 on the kinematic plate 112. The FOUP advance plate assembly 122 is then raised to the uppermost position. The FOUP 2 is eventually engaged by the kinematic plate 112 and is lifted off the upper supports 406 of the shuttle 402. In a preferred embodiment, no further adjustment between the FOUP 2 and the kinematic plate 112 is necessary to move the FOUP towards the mounting plate 116 and remove the FOUP door 6.

The rail 420 may comprise any mechanism known within the art, such as a conveyor or a conventional railway. The rail 420 may also be mounted within the fabrication facility at many heights. For example, the rail 420 may be mounted to, flush with, below, or elevated with respect to the facility floor 4. If the shuttle 400 is not elevated, the shuttle 400 preferably has a low profile to allow operator foot traffic over the rail 420.

The shuttle 400 may travel along any type of rails. By way of example only, the rails 420 may comprise a primary drive rail 422 and a secondary support rail 424. The shuttle 400 shown in FIGS. 20-24 can simultaneously transport two 300 mm FOUPs 2A and 2B. It is within the spirit and scope of the present invention for the shuttle to carry two or more FOUPs. Simultaneously transporting FOUPs 2A and 2B with one shuttle 400 allows for more flexible delivery sequences and provides buffering advantages. For example, a two pod shuttle 400 has the ability to do "fast swaps." In other words, the shuttle 300 can retrieve a first FOUP 2A from a load port 100A onto an empty support 402 and then load a second FOUP 2B from the shuttle 400 to the same load port 100A. This would reduce the number of load ports 100 required at each processing tool 101 because the time required to exchange a finished FOUP (e.g., wafers in the FOUP are done with the processing step) for a new FOUP with unprocessed wafers would be very short.

Conventional process tools often have multiple load port locations so that a finished FOUP can sit and wait for an AMHS (e.g., OHT system) to remove it from the load port while another load port holds a FOUP in process, and a third load port can be loaded with a new FOUP from the AMHS. For example, FIG. 16 illustrates a processing tool 101 having two load ports—a first load port 100A and a second load port 100B. Having two load ports enables continuous tool operation without being gated by the AMHS. With a fast-swap shuttle 400, a third load port would be unnecessary to achieve continuous tool operation.

A shuttle 400 that could accommodate three or four FOUPs could service two or three processing tools in sequence with fast swaps at each tool. The shuttle could also take three or four FOUPs from an origination point—maybe a stocker—and deliver the FOUPs to three or four tools consecutively in one trip. For example, several FOUPs may be loaded and unloaded from various tools during a northbound leg up a bay (e.g., shuttle 400 traveling from processing tool 101A to processing tool 101B). A bay is defined as, but not limited to, multiple tools arranged in a row. The shuttle 400 would then reverse direction (e.g., shuttle 400 traveling from processing tool 101B to processing tool 101A) and several FOUPs may be loaded and unloaded from various tools during a southbound leg.

The rail system may branch, curve or ramp up/down to move the shuttle 400 along various paths on the facility floor 4, above the floor 4, below the floor 4, between bays and within bays. All shuttles 400 could be made identical in terms of pod position relative to fiducials. This would eliminate tool "teaching" that is required with current AGVs that incorporate a robot arm. This improves serviceability and time to remove and replace shuttles.

The shuttle 400 may travel at high speeds, for example, only when enclosed in a tube 190, or behind a fence 150. In areas where there is no enclosure, to allow foot traffic crossing for example, the shuttle 400 would move in a slower mode and may incorporate look ahead sensors or move behind a light curtain to avoid collision. Intersections with foot traffic may have a physical gate or may have a traffic light system to indicate whether foot traffic may pass over the rail or not.

A rail-less shuttle, or AGV, may follow a visible line on the floor or navigate relative to fiducials placed on the floor (e.g., dead reckoning system), ceiling, walls or, on load ports and similar structures. A rail-less shuttle provides several benefits such as leaving the floor unobstructed for foot traffic and equipment rolling, eliminating the cost of the rail and not restricting shuttle motion to linear movements between adjacent tools. For example, a rail-less shuttle could cross a bay aisle to transport FOUPs between tools performing consecutive process steps located on opposite sides of an aisle and the shuttles could pass one another where needed. In addition, individual tools could be taken off-line for service and the rail-less vehicles could simply be redirected around the load port area during this service. Advanced vehicles could navigate the entire factory, enter elevators and travel down aisles also occupied by tool operators.

Figure 25:
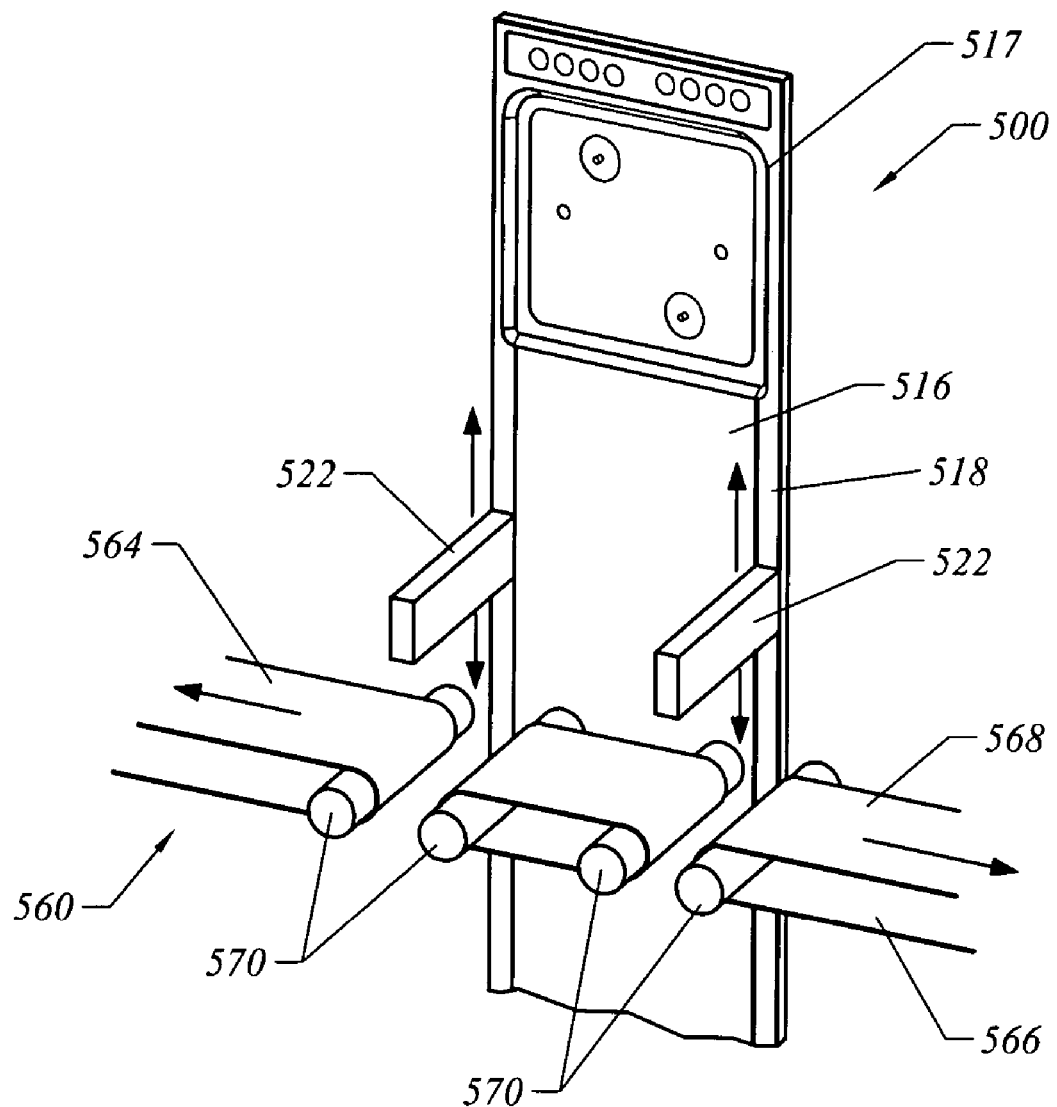
FIG. 25 is a perspective view of another embodiment of the present invention, illustrating a conveyor having a belt for movably supporting a container.
Figure 26A:
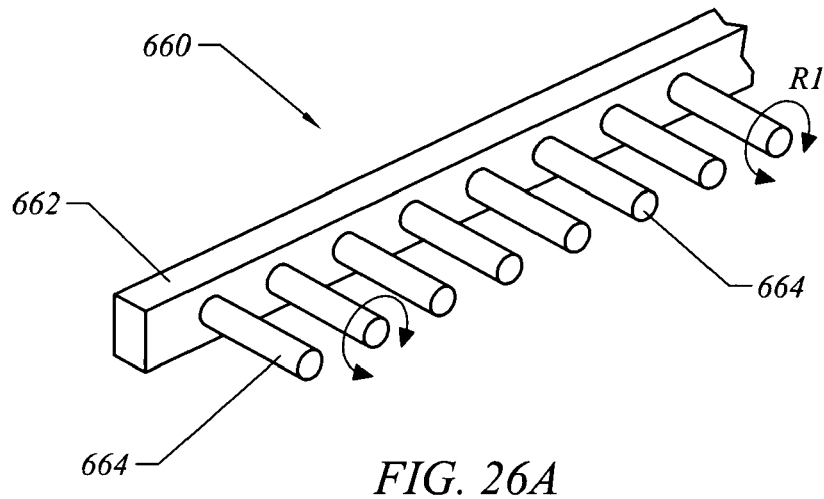
FIGS. 26A and 26B are views of another embodiment of the present invention, illustrating a conveyor having cantilevered wheels for movably supporting a container.
Figure 26B:
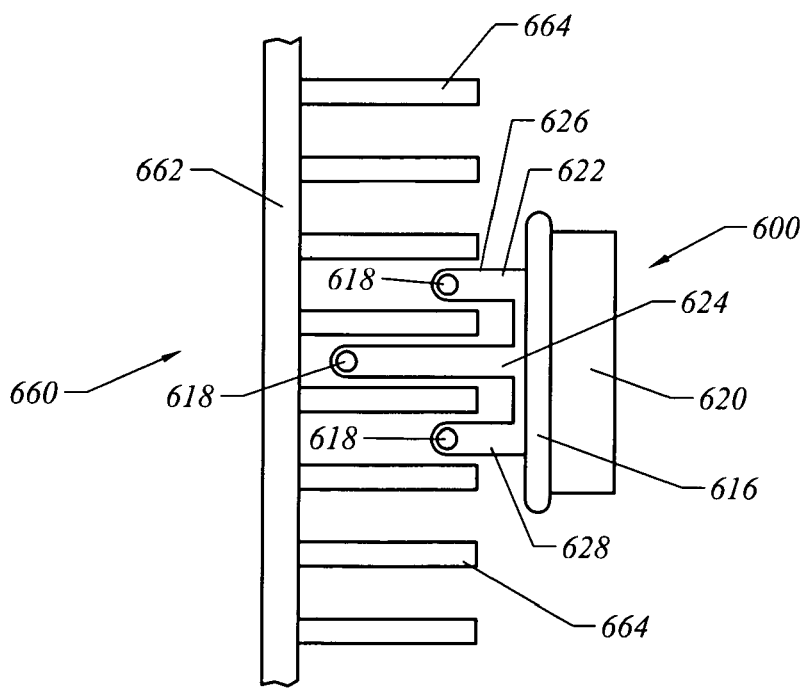
Figure 27:
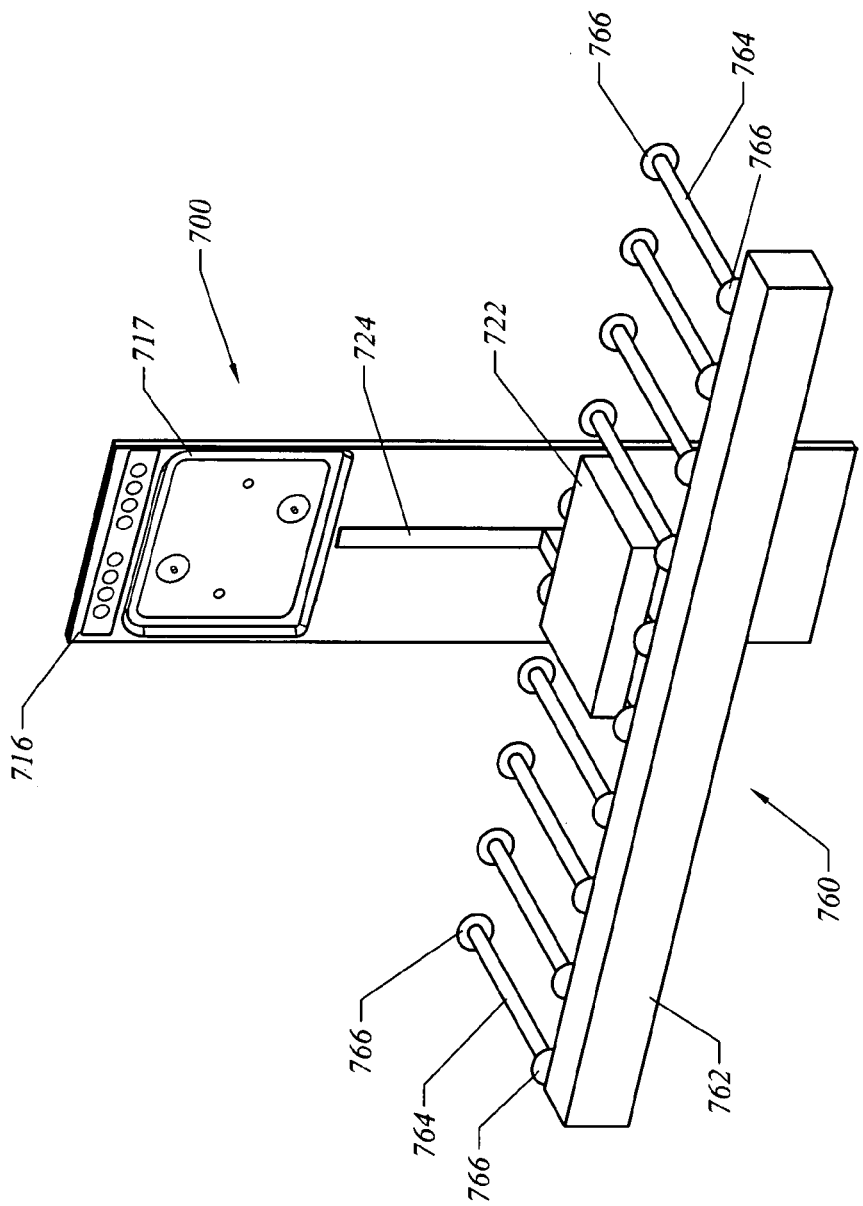
FIG. 27 is a perspective view another embodiment of the present invention, illustrating a conveyor having cantilevered wheels for movably supporting a container.

FIG. 25-27 illustrate that a load port is not required to have either a container advance assembly for moving a FOUP horizontally or a port door, and may only need to move a FOUP vertically between two heights. For example, FIG. 25 illustrates that a load port 500 includes, among other things, a mounting plate 516 having an opening 517 and a vertically movable support structure 522. Similar to the embodiments described above, the load port 500 also includes a mechanism for moving the support structure 522 vertically between the conveyor 560 and the opening 517. The FIG. 25 embodiment illustrates a support structure 522 having two supports for contacting the bottom surface of a FOUP.

The conveyor 560 shown in FIG. 25 is divided into three sections at each load port 500 to accommodate the support structure 522. By way of example only, the conveyor 560 comprises a middle section 562, a left section 564 and a right section 568. Each conveyor section, in this embodiment, comprises a belt 568 and a pair of rollers 570. In one embodiment, and as shown in FIG. 25, the rollers 570 that are part of the middle section 562 of the conveyor 560, are rotatably mounted to the mounting plate 516.

Each section of the conveyor 560 is separated apart from the other, creating a gap between each section of the conveyor. The gaps allow the support structure 522 to travel below the conveyor 560 and wait for a FOUP to arrive on the middle section 562 of the conveyor 560. After a FOUP arrives on the middle section 562 and comes to rest, the support structure 522 may rise vertically to engage the bottom surface of the FOUP and lift the FOUP off the conveyor 560.

FIG. 26 illustrates a transport and delivery system comprising a load port 600 and a conveyor 660. The load port 600 includes, among other things, a mounting plate 616, a support structure 622 and a mechanism 620 for moving the support structure 622 vertically. In this embodiment, the support structure 622 comprises a structure having a first support 624, a second support 626 and a third support 628. Each support includes a kinematic pin 618 at the distal end of each support. This structure replaces the kinematic plate 112 in the load port 100. The conveyor 660, by way of example only, comprises a rail 662 and multiple cantilever rollers 664. As shown in FIG.

26B, the each support 624, 626 and 626 of the support structure 622 is able to pass between a pair of adjacent rollers 664 so that the support structure 622 can be lowered below the rollers 664. A FOUP preferably comes to rest on the rollers 664 with the kinematic grooves in the bottom surface of the FOUP aligned with the kinematic pins 618 on the support structure 622. The support structure 622 is then raised vertically to engage the bottom surface of the FOUP and lift the FOUP off the conveyor 660 to a predetermined height.

FIG. 27 illustrates another transport and delivery system that comprises a load port 700 and a conveyor 760. The load port 700 includes, among other things, a mounting plate 716 having an opening 716 and a slot 724, and a support structure 722. The support structure 722, in this embodiment, preferably moves only vertically between the opening 717 and the conveyor 760. However, it is within the scope of the invention for the support structure 722 to also move horizontally. The support structure 722 may comprise any structure that supports a container including, but not limited to, a kinematic plate for supporting a FOUP or any other container support mechanism. The conveyor 760 comprises a rail 762 having cantilevered rollers 764 with rotatable wheels 766 located at both ends of each roller 764. In this embodiment, the rollers 764 preferably do not contact the container—only the wheels 766—to minimize contact with the container.

To support a container located directly in front of the load port 700, two wheel 766 are rotatably mounted to the mounting plate 716 of the load port 700. These two wheels may be passive wheels or drive wheels. Eliminating the rollers 764 on the conveyor 760 for the section in front of the load port 700 allows the support structure 722 to be lowered below the wheels 766. At this point, when a container comes to rest in front of the load port 700, the support structure 722 may then be raised to lift the container off the conveyor 760. The support structures and conveyors illustrated in FIGS. 25-27 are interchangeable.

It should be appreciated that the above-described mechanisms and process for FOUP transport between a conveyor and a load port are for explanatory purposes only and that the invention is not limited thereby. Having thus described a preferred embodiment of a method and system for FOUP transportation, it should be apparent to those skilled in the art that certain advantages of the within system have been achieved. It should also be appreciated that various modifications, adaptations, and alternative embodiments thereof may be made within the scope and spirit of the present invention. For example, the use of conveyors has been illustrated in a semiconductor fabrication facility, but it should be apparent that many of the inventive concepts described above would be equally applicable to the use of other non-semiconductor manufacturing applications.

The invention claimed is:

1. A system for presenting a container storing at least one article to a processing tool, comprising:
    (a) a load port, including:
        a frame having an opening;
        a support structure being adapted to receive a container; and
        a drive mechanism for moving said support structure substantially vertically between a first height and a second height; and
    (b) a conveyor for movably supporting the container substantially along a container transport plane;
    wherein a container traveling on said conveyor moves unobstructed over said support structure when said support structure is located at said second height,
    wherein the container traveling unobstructed does not contact said support structure while traveling over said support structure located at said second height,
    wherein said support structure, when located at said second height, is located below said transport plane;
    wherein said support structure, when located at said first height, is located above said transport plane.

2. The system as recited in claim 1, wherein said load port further includes a port door being adapted to move between a closed position preventing an article from passing through said opening and an open position allowing an article to pass through said opening.

3. The system as recited in claim 1, wherein said support structure comprises a container advance assembly being adapted for moving the container substantially horizontally.

4. The system as recited in claim 1, wherein said support structure is able to receive a container for transporting semiconductor wafers having a diameter between 150 mm-500 mm.

5. The system as recited in claim 1, wherein said support structure is being adapted to receive a container for transporting a flat panel display.

6. The system as recited in claim 1, wherein said mechanism comprises:
    an arm affixed to said support structure; and
    a drive assembly for moving said arm vertically.

7. The system as recited in claim 6, wherein said conveyor comprises:
    a first rail parallel to the direction of travel of a container in the conveyor; and
    a second rail spaced apart from said first rail and parallel to the first rail;
    wherein the portion of said first rail passing said load port includes a feature allowing said arm to pass unobstructed through at least a pan of said first rail.

8. The system as recited in claim 1, wherein said conveyor comprises:
    a first rail having a top surface; and
    a second rail spaced apart from said first rail.

9. The system as recited in claim 8, wherein said mechanism includes a vertically adjustable arm having a distal end affixed to said support structure.

10. The system as recited in claim 1, wherein said conveyor comprises a belt conveyor.

11. The system as recited in claim 1, wherein said conveyor comprises a rail and a plurality of rollers each rotatably secured to said rail, each one of said plurality of rollers being spaced apart from each other and extending outward from said rail.

12. The system as recited in claim 11, wherein said support structure comprises at least two fingers spaced apart from each other such that each said finger nests between adjacent rollers when said support structure is located at said second height.

13. In a semiconductor fabrication apparatus having a conveyor for movably supporting a container along a first rail and a second rail between processing tools, a load port comprising:
    a frame having an opening;
    a support structure being adapted to receive a container; and
    a mechanism, connected to said support structure, for moving said support structure substantially vertically with respect to said frame,
        said mechanism being adapted to lower said support structure to a predetermined position between said first and second rails of said conveyor such that a container moving along said conveyor passes unobstructed over said support structure, wherein said support structure, when located at said predetermined position, is located below the container moving plane, said mechanism being adapted to raise said support structure to an upper position such that another container moving along said conveyor passes unobstructed under said support structure when said support structure is at the upper position.

14. The system as recited in claim 13, wherein said support structure comprises a container advance assembly for moving a container seated on said advance assembly substantially horizontally with respect to said frame.

15. The system as recited in claim 13, wherein said support structure is able to receive a container for storing semiconductor wafers having a diameter between 150 mm-600 mm.

16. The system as recited in claim 13, wherein said support structure is being adapted to receive a container for transporting a flat panel display.

17. The system as recited in claim 13, wherein said mechanism comprises:

an arm having a distal end affixed to said support structure; and a drive assembly for moving said arm vertically with respect to said frame.

18. The system as recited in claim 17, wherein the portion of said first rail passing said load port includes a feature allowing said arm to pass unobstructed through at least a portion of said first rail.

19. A semiconductor fabrication apparatus having a conveyor for movably supporting a container, storing at least one semiconductor wafer, between processing tools, the conveyor being adapted to move the container substantially along a container transport plane, a load port comprising:

a frame having an opening;

a horizontally adjustable support structure for receiving the container;

an arm affixed to said horizontally adjustable support structure;

a drive mechanism, connected to said arm, for moving said support structure substantially vertically with respect to said frame, said mechanism being adapted to lower said horizontally adjustable support structure to a predetermined position having an elevation lower than the container transport plane to allow a container moving along the conveyor to pass unobstructed over said horizontally adjustable support structure and to pass unobstructed without contacting said support structure, said mechanism being adapted to raise said load horizontally adjustable support structure to an upper position having an elevation higher than the container transport plane.

* * * * *